United States Patent
Murata

(10) Patent No.: US 8,331,181 B2
(45) Date of Patent: Dec. 11, 2012

(54) SEMICONDUCTOR MEMORY CIRCUIT EQUIPPED WITH MULTIPLEXER FOR REDUCING COUPLING CAPACITANCE OF NON-SELECTED MAIN BIT LINES

(75) Inventor: Nobukazu Murata, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 78 days.

(21) Appl. No.: 12/954,723

(22) Filed: Nov. 26, 2010

(65) Prior Publication Data

US 2011/0128781 A1   Jun. 2, 2011

(30) Foreign Application Priority Data

Nov. 27, 2009   (JP) .................................. 2009-270341

(51) Int. Cl.
   *G11C 7/02*  (2006.01)
(52) U.S. Cl. .............. 365/206; 365/189.02; 365/189.15; 365/190; 365/185.02; 365/185.03; 365/185.16; 365/185.25
(58) Field of Classification Search ............. 365/185.02, 365/185.03, 185.16, 185.06, 185.05, 185.23, 365/185.25, 189.02, 189.15, 190, 206
See application file for complete search history.

(56) References Cited

U.S. PATENT DOCUMENTS
7,885,136 B2 * 2/2011 Matsui et al. ............ 365/230.02

FOREIGN PATENT DOCUMENTS
JP   2006-309811 A   11/2006
WO  2006/035502 A   4/2006

* cited by examiner

*Primary Examiner* — Andrew Q Tran
(74) *Attorney, Agent, or Firm* — Kuboterz & Associates, LLC

(57) ABSTRACT

A semiconductor memory circuit includes a memory cell array having a plurality of memory cells arranged in a row direction and a column direction; a row selecting unit for selecting the memory cells of the memory cell array aligned in the row direction; a column selecting unit for selecting the memory cells of the memory cell array aligned in the column direction; a plurality of main bit lines for outputting data of the memory cells; a data reading unit for reading data of one of the memory cells selected with the row selecting unit and the column selecting unit; a first multiplexer for connecting one of the main bit lines connected to the memory cell to the data reading unit; and a second multiplexer for connecting an adjacent main bit line situated adjacently outside the main bit line to a charging/discharging voltage source for setting at a specific voltage.

7 Claims, 21 Drawing Sheets

SEMICONDUCTOR MEMORY CIRCUIT EQUIPPED WITH MULTIPLEXER FOR REDUCING COUPLING CAPACITANCE OF NON-SELECTED MAIN BIT LINES

BACKGROUND OF THE INVENTION AND RELATED ART STATEMENT

The present invention relates to a semiconductor memory circuit.

When data are read from a non-volatile semiconductor memory circuit such as a flash memory, a logical level of the data to be read is determined according to a current value of a memory cell to be read. A circuit that determines the logical level based on a current distribution or a current difference (hereinafter referred to as a current window) of a memory cell between logical levels is called a sense amplifier. In addition, the current of the memory cell to be read flows to the sense amplifier via a bit line that connects to the memory cell (refer to Patent References 1 and 2).

FIG. 19 is a block diagram, which schematically shows a configuration of a conventional NOR semiconductor memory circuit 1000. FIG. 20 is a circuit diagram of memory cell arrays 120 and a multiplexer 130 of the semiconductor memory circuit 1000. As shown in FIGS. 19 and 20, the semiconductor memory circuit 1000 includes an M number of the memory cell arrays 120, which include a plurality of memory cells arranged in rows and columns (e.g., MC00, ..., MC27, ..., MCN0, ..., MCN7); a multiplexer 130, which includes a plurality of transistors (e.g., transistors 130_0a, 130_0b, 130_1a, 130_1b, 130_2a, 130_2b, ...); and sense amplifiers SA0 and SA1.

In the semiconductor memory circuit 1000, COMMON is a common voltage source of the memory cells. DS[2M−1:0] (i.e., DS0, ..., DS(2M−1)) are sub bit line selection signals applied to control terminals of transistors between the common voltage source COMMON and the sub bit lines (transistors 120_0, 120_2, 120_4, 120_6, and 120_8 are shown in FIG. 20). SS[M−1:0] (i.e., SS0, ..., SS(M−1)) are sub bit selection signals applied to control terminals of transistors (121_1, 121_3, 121_5, 121_7, ... are shown in FIG. 20) between the main bit lines and the sub bit lines. Y[K−1:0] (i.e., Y0, ..., Y(K−1)) are main bit selection signals applied to control terminals of transistors (transistors 130_0a, 130_0b, 130_1a, 130_1b, ... in the configuration 130 of FIG. 20) between the sense amplifiers SA0 and SA1 and the main bit lines.

WL[N×M−1:0] (i.e., WL0, ..., WL (N×M−1)) are word lines. ICELL0 and ICELL1 are current values of memory cell to be read, and respectively flow to the sense amplifiers SA0 and SA1. The sense amplifiers SA0 and SA1 determine the logical levels of the memory cells to be read from the current values ICELL0 and ICELL1, and the determination results are output to output terminals DOUT0 and DOUT1. Here, "M" is the number of the memory cell arrays 120. "N" is the number of word lines provided in each memory cell array 120. "K" is the number of main bit selection signals Y (the number of signals) to select main bit.

SBL[8:0] (i.e., SBL0, ..., SBL8) are sub bit lines, and MBL[3:0] (i.e., MBL0, ..., MBL3) are main bit lines. The M number of the memory cell arrays 120 are connected to the main bit lines MBL[3:0]. To select a sub bit line in each memory cell array 120, a sub bit line selection signal that is different from others (one of SS[M−1:0]) is applied. Transistors indicated with prefix "MC" (e.g. MC00, ..., MC27, ...) are memory cells.

As indicated as the memory cell arrays 120 in FIG. 20, each NOR memory cell array generally includes a plurality of word lines WL0, WL1, ..., WLN to connect with gate terminal(s) of the memory cell and a plurality of sub bit lines SBL0, SBL1, ... to connect with source terminal(s) or drain terminal(s) (hereinafter referred to as "diffusion layer(s)"), which are arranged in a lattice pattern. The memory cells MC00, ..., MC27, ... are usually disposed at every intersection of the respective word lines and bit lines.

In this case, the memory cell may be, for example, is configured having a P-type substrate region, a gate oxide film provided on the P-type substrate region, gate terminals (floating gates) provided on the gate oxide film, and a pair of N-type diffusion regions (diffusion layers) having a p-type substrate region therebetween. A memory cell to read may be selected by first selecting a word line to connect with a gate terminal of a memory cell to be read, connecting a bit line to connect with one of the diffusion layer to the sense amplifier SA0 or the sense amplifier SA1, and then connecting the other diffusion layer to the common voltage source COMMON.

The voltages of the sub bit lines SBL0, SBL1, ... may vary depending on the presence of connection to the sense amplifier SA0 or SA1, the state of a memory cell to connect, and other factors. Therefore, even at sub bit lines that are not selected, transient voltage fluctuation occurs. In addition, voltages of the sub bit lines SBL0, SBL1, ... are affected by voltage fluctuation of the adjacent sub bit lines depending on the coupling capacity. This influence brings the current, which is different from the original one of the memory cell to be read, to the selected sub bit line. As a result, the current window may vary or decrease, so that it is preferred to reduce the influence from the adjacent sub bit lines.

FIG. 21 is a diagram to explain a data reading operation of a conventional semiconductor memory circuit. From now on, the data reading operation of the semiconductor memory circuit 1000 will be described referring to FIG. 21. Here, a case of selecting the memory cells MC02 and MC05 will be described. When the word line WL0 is selected in the memory cell array 120, the memory cells MC00, MC01, ..., MC07 in the row that contains the memory cells MC02 and MC05 are electrically connected. When the sub bit line selection signal DS1 is selected, the common voltage source COMMON becomes connected to one of the diffusion layers of the memory cell MC02 via the transistor 120_2 and the sub bit line SBL2, and the common voltage source COMMON becomes connected to one of the diffusion layers of the memory cell MC05 via the transistor 120_6 and the sub bit line SBL6.

When the sub bit line selection signal SS0 is selected, the main bit line MBL1 connects to the other diffusion layer of the memory cell MC02 via the sub bit line SBL3 and the transistor 121_3, and the main bit line MBL2 connects to the other diffusion layer of the memory cell MC05 via the sub bit line SBL5 and the transistor 121_5. When the main bit line selection signal Y1 is selected in the multiplexer 130, the main bit line MBL1 connects to the sense amplifier SA0 via the transistor 130_1a, and the main bit line MBL2 connects to the sense amplifier SA1 via the transistor 130_1b.

With this operation, the memory cells MC02 and MC05 becomes in the selected states, currents of ICELL0 and ICELL01 flow to the sense amplifiers SA0 and SA1, respectively. The sense amplifier SA0 outputs the logic level determined from the current value ICELL0 to the output terminal DOUT0, and the sense amplifier SA1 outputs logic level determined from the current value ICELL1 to the output terminal DOUT1.

Here, for selecting the αth (α=0, 1, 2, ..., M−1) sub bit line selection signal SSα and a main bit line selection signal Y(2n−2) that is with even number (here, n=1, 2, ...), (α×2+0)th sub bit line selection signal DS (α×2) is selected, and for selecting main bit line selection signal Y(2n−1) that is with an odd number, (α×2+1)th sub bit line selection signal DS(α×2+1) is selected.

As described above, the semiconductor memory circuit 1000 employs the circuit configuration, in which a pair of adjacent main bit lines (e.g. MBL1 and MBL2 in FIG. 21) is selected at the same time and then the respective main bit lines are connected to the sense amplifiers SA0 and SA1. Since the voltages of the bit lines connected to the sense amplifiers SA0 and SA1 become stabilized, it is possible to reduce the influences among the pair of adjacent main bit lines, sub bit lines connected to the pair of main bit lines, and the sub bit lines that are located between the sub bit lines connected to the main bit lines.

For example, by selecting the main bit line selection signal Y1 so as to select the pair of adjacent main bit lines MBL[2:1] at once, it is possible to reduce influences among the main bit lines MBL2 and MBL 1, the sub bit lines SBL5 and SBL3, and the sub bit line SBL4.

Patent Reference 1: Japanese Patent Publication No. 2006-309811

Patent Reference 2: International Patent Application No. 2006/035502

In these years, since the wiring intervals of bit lines becomes smaller due to finer memory cell configurations of these years, the coupling capacity between the bit lines has increased and thereby the influences of the voltage fluctuation of the adjacent bit lines on the current values have also increased. On the other hand, since the memory cells become finer and multi-valued, the current difference between the current windows decreases. Accordingly, influences of the current value change due to voltage fluctuation of the bit lines on the current windows have relatively increased.

In the conventional techniques, by selecting a pair of adjacent main bit lines at once, the influences between adjacent bit lines are reduced by each other. On the other hand, the main bit lines, which are next to outside the selected pair of main bit lines, are connected to the common voltage source via a non-selected memory cell. Since driving force of a memory cell is relatively small, when the voltage of the main bit lines that are adjacent outside significantly fluctuates, the voltage fluctuation due to charge/discharge to/from the common voltage source via the non-selected memory cell continues during the reading operation. As already described above, this voltage fluctuation affects the current windows of the selected memory cell.

For example, when a pair of adjacent main bit lines is selected and connected to a sense amplifier, sharp voltage fluctuation occurs on those main bit lines. Because of this, voltage fluctuation also occurs on the adjacent main bit lines outside the selected pair of the main bit lines. When the voltage fluctuation is relatively significant and occurred sudden, there is influence on the current window of the selected memory cell.

In view of the problems described above, an object of the present invention is to solve the problems in conventional techniques, and is to provide a semiconductor memory circuit, which can reduce the voltage fluctuation of main bit lines that are adjacent outside a selected pair of main bit lines.

Further objects and advantages of the invention will be apparent from the following description of the invention.

SUMMARY OF THE INVENTION

In order to attain the objects described above, according to the invention, a semiconductor memory circuit includes a memory cell array having a plurality of memory cells arranged in a row direction and a column direction; a row selecting unit for selecting a memory cell of the memory cell array aligned in the row direction; a column selecting unit for selecting a memory cell of the memory cell array aligned in the column direction; a plurality of main bit lines for outputting data of the memory cells; a data reading unit for reading data of the memory cell selected with the row selecting unit and the column selecting unit in the memory cell; a first multiplexer for connecting a main bit line connected to the memory cell selected in the memory cell array to the data reading unit; and a second multiplexer for connecting an adjacent main bit lines situated outside the main bit line connected to the memory cell selected to a charging/discharging voltage source set at a specific voltage.

According to the invention, it is possible to reduce the voltage fluctuation of the adjacent main bit lines outside the selected pair of main bit lines. Accordingly, the data reading unit can precisely detect an original current of the memory cell to be read.

DETAILED DESCRIPTION OF PREFERRED EMBODIMENTS

Hereunder, embodiments of the present invention will be explained with reference to the accompanying drawings.

First Embodiment

Figure 1:
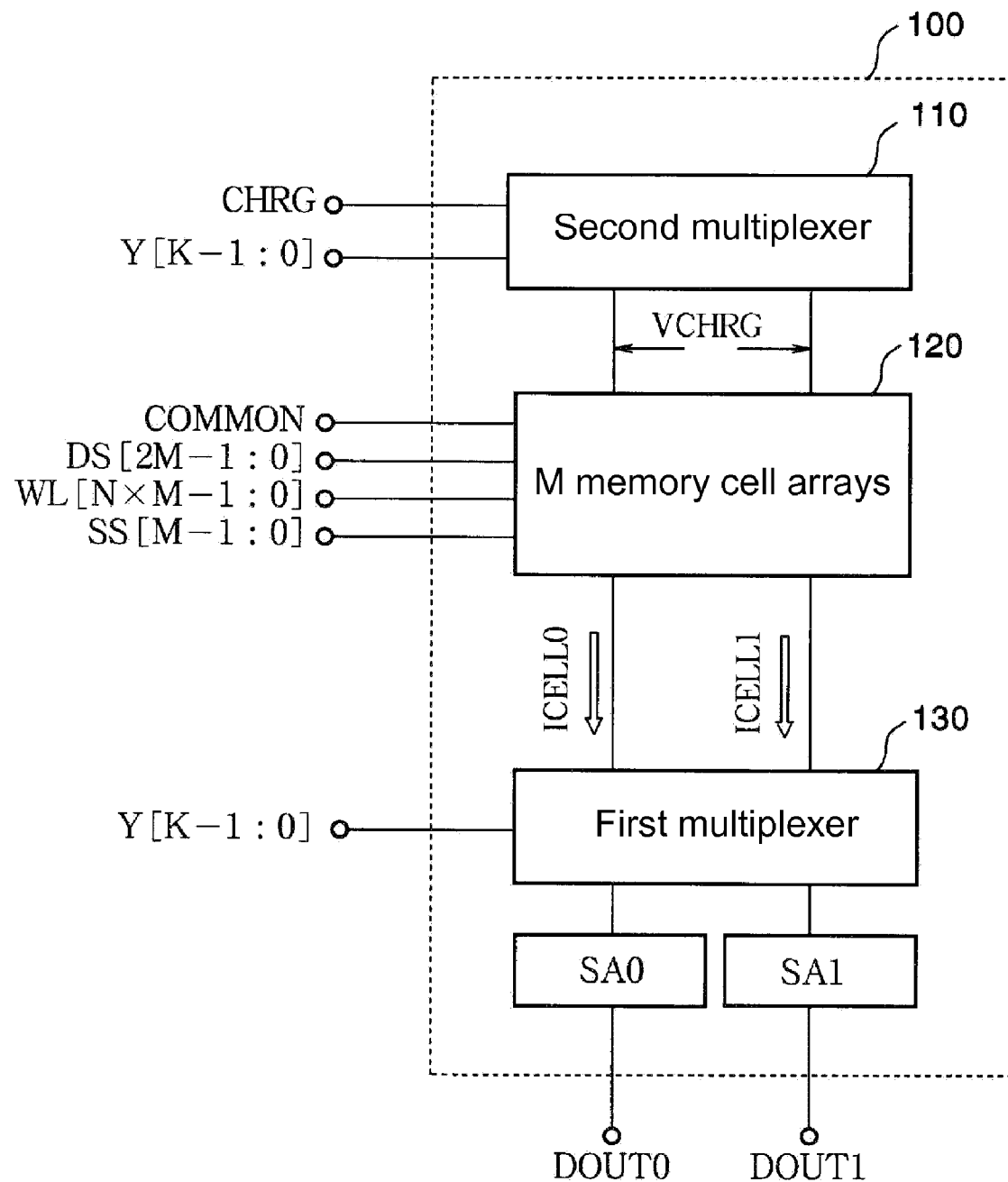
FIG. 1 is a block diagram, which schematically illustrates a configuration of a semiconductor memory circuit according to a first embodiment of the invention.
Figure 2:
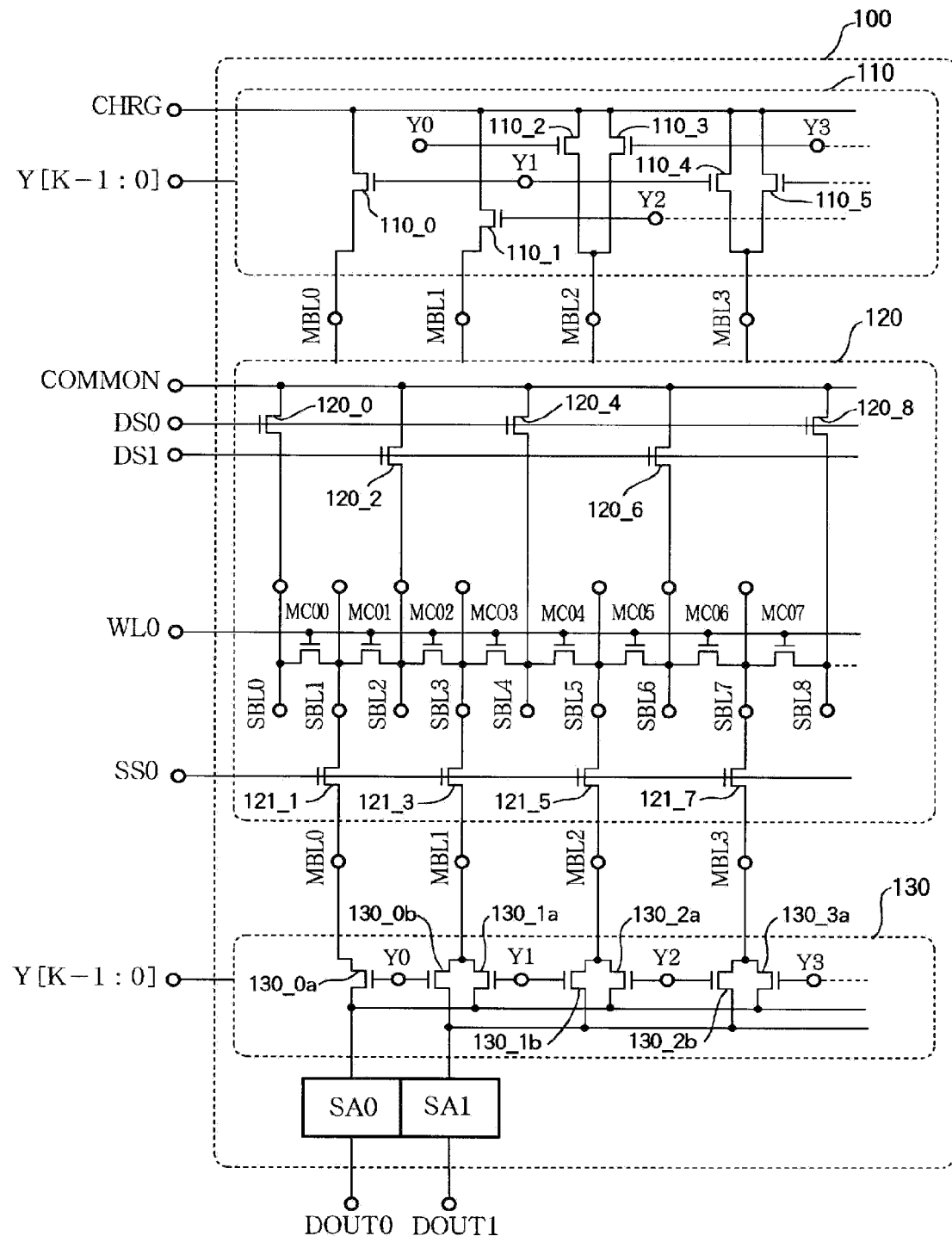
FIG. 2 is a circuit diagram including a second multiplexer, a memory cell array, and a first multiplexer of the semiconductor memory circuit according to the first embodiment.

A first embodiment of the present invention will be explained. FIG. 1 is a block diagram schematically showing the configuration of a semiconductor memory circuit 100 according to the first embodiment of the invention. FIG. 2 is a circuit diagram including a second multiplexer 110, memory cell array 120, and a first multiplexer 130 of the semiconductor memory circuit 100 according to the first embodiment.

Figure 19:
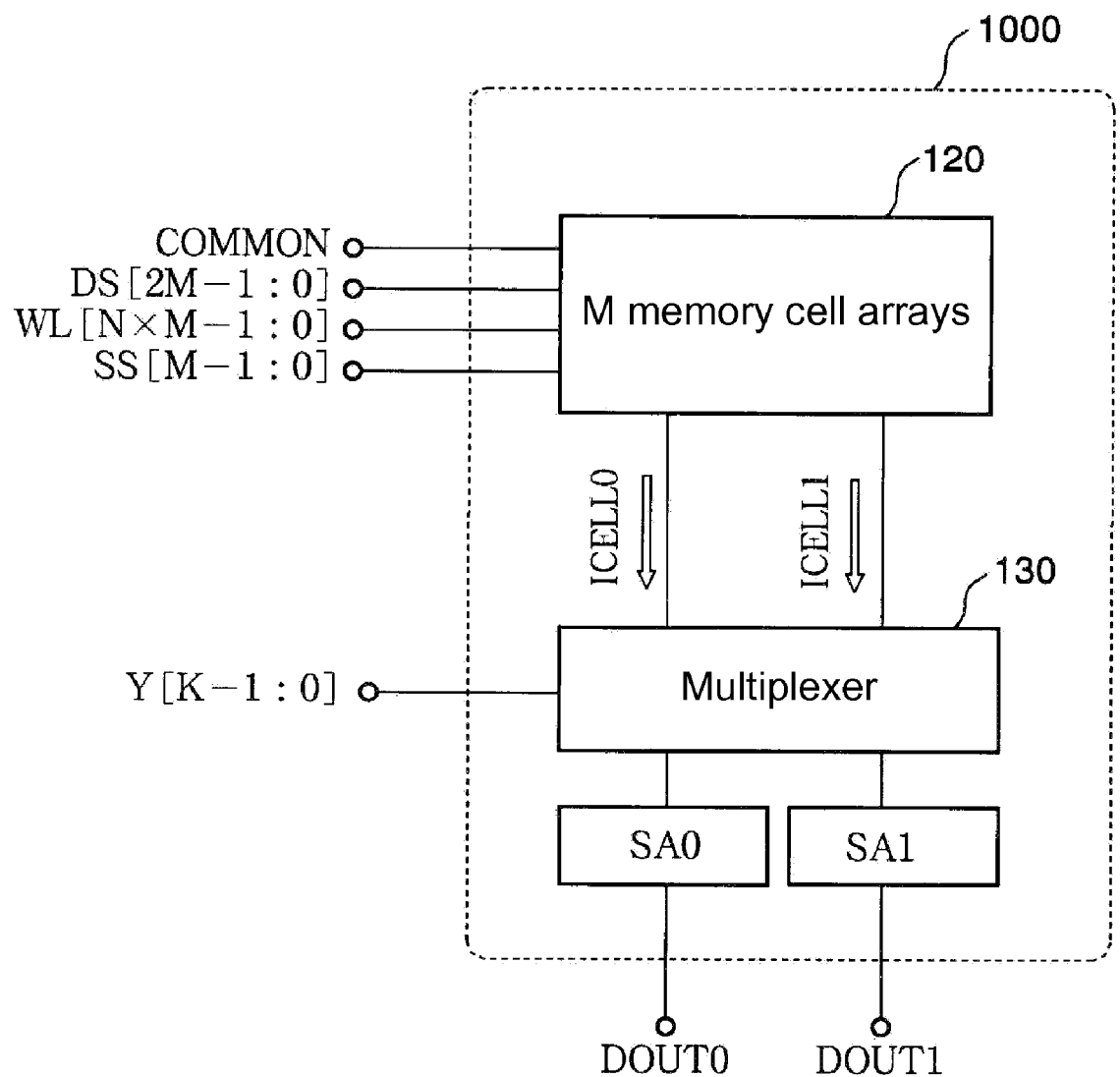
FIG. 19 is a block diagram schematically showing a conventional semiconductor memory circuit.
Figure 20:
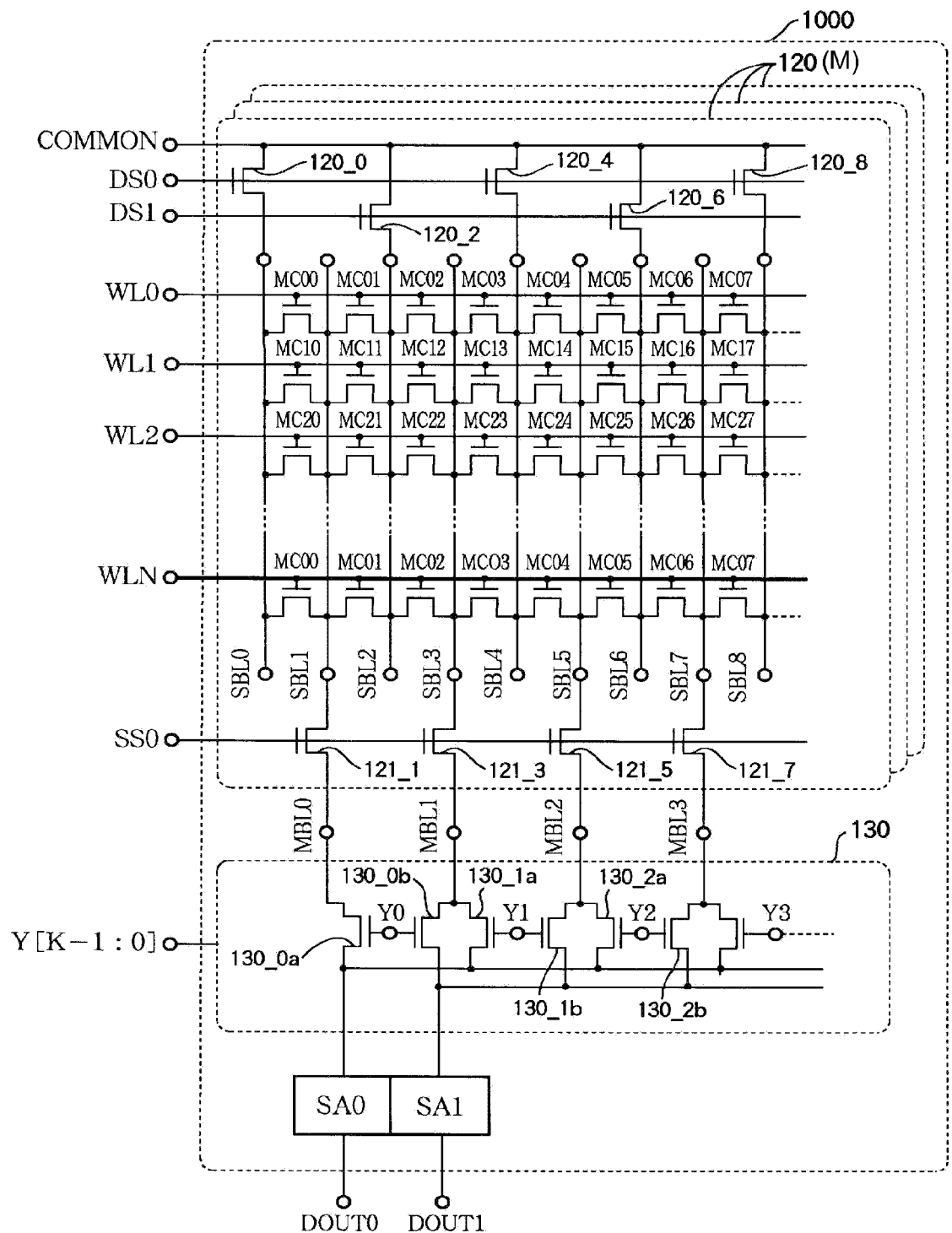
FIG. 20 is a circuit diagram including memory cell arrays and a multiplexer of the conventional semiconductor memory circuit.
Figure 21:
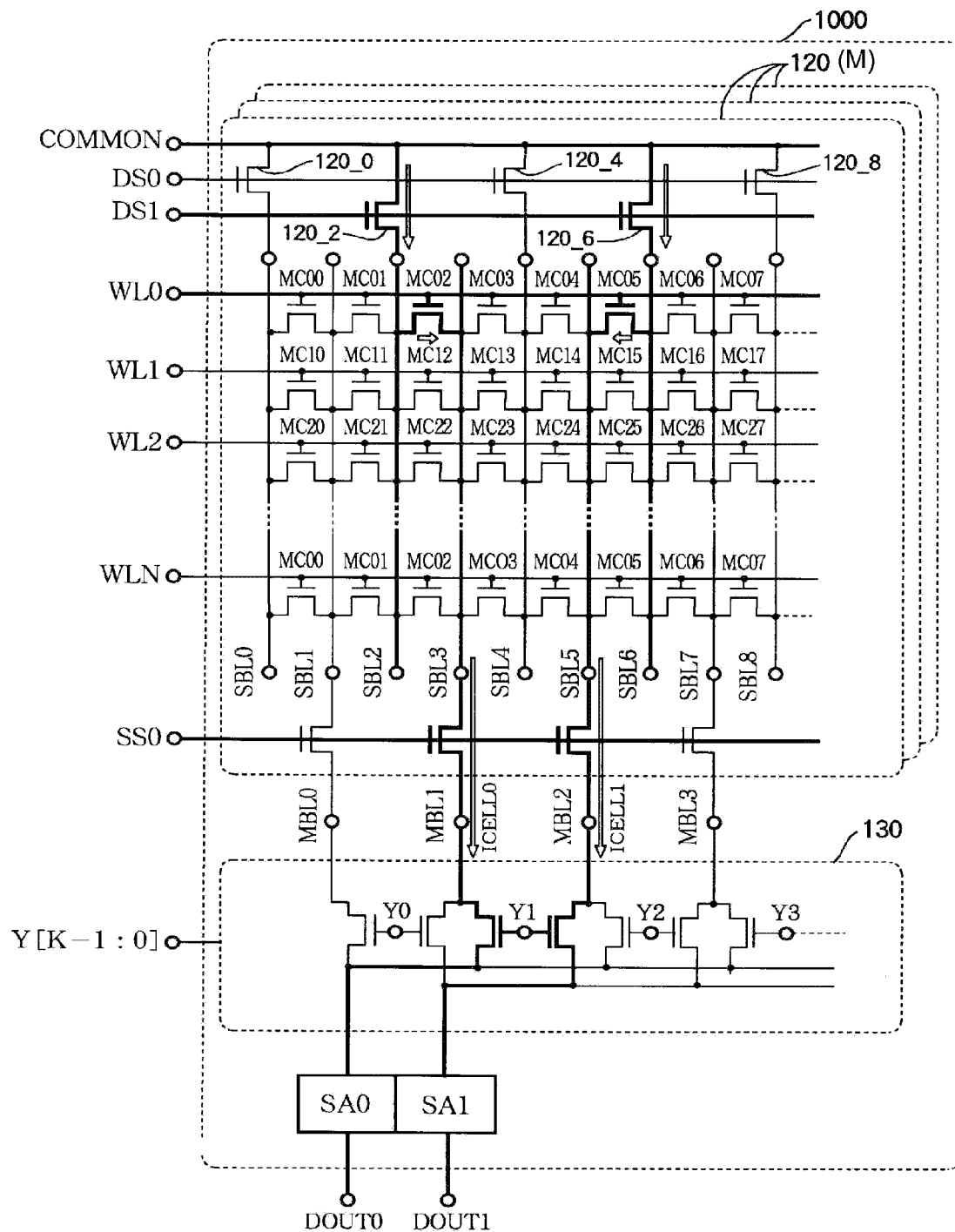
FIG. 21 is an explanatory diagram of data reading operation of the conventional semiconductor memory circuit.

As shown in FIGS. 1 and 2, the semiconductor memory circuit 100 of the first embodiment includes a second multiplexer 110, which includes a plurality of transistors (e.g. transistors 110_0, 110_1, 110_2, 110_3, 110_4, 110_5, . . . ); M memory cell arrays 120, which include a plurality of memory cells (e.g. MC00, . . . , MC07) aligned in rows and columns; a first multiplexer 130, which includes a plurality of transistors (e.g. transistors 130_0a, 130_0b, 130_1a, 130_1b, 130_2a, 130_2b, . . . ); and sense amplifiers SA0 and SA1. Since the semiconductor memory circuit 100 of the first embodiment has the second multiplexer 110, it differs from a conventional semiconductor memory circuit 1000. Another configuration of the semiconductor circuit 100 of the first embodiment is similar to the one of the semiconductor memory circuit 1000 shown in FIG. 19.

"CHRG" is a voltage source for charging/discharging adjacent main bit lines. "COMMON" is a common voltage source of memory cells. DS[2M−1:0] is a sub bit line selection signal applied to a control terminal of transistors (transistors 120_0, 120_2, 120_4, 120_6, and 120_8 are shown in FIG. 2) between the common voltage source COMMON and sub bit lines.

Y[K−1:0] is a main bit line selection signal applied on a control terminal of transistors (transistors 130_0a, 130_0b, 10_1a, 130_1b, . . . ) in the configuration 130 of FIG. 2) between the sense amplifiers SA0 and SA1 and the main bit lines. WL[N×M−1:0] is a word line that composes the row selecting unit to select one row of memory cells. Here, "M" is the number of word lines of each memory cell array 120. "K" is the number of main bit line selection signals Y (the number of signals).

SBL[8:0] are sub bit lines, and MBL[3:0] are main bit lines. The main bit lines MBL[3:0] connect to M memory cell arrays 120, but only one memory cell array 120 is shown in FIG. 2. In FIG. 2, only word line WL0, which is one of the plurality of word lines, is shown. In addition, the sub bit lines SBL[8:0], main bit lines MBL[3:0], the transistors between common voltage source COMMON and sub bit lines, and the transistors between the main bit lines and sub bit lines compose the column selecting unit to select the memory cells in each column. Here, each signal input to the semiconductor memory circuit 100 is input from a circuit (not illustrated) that controls the operation of the semiconductor memory circuit 100.

Figure 3:
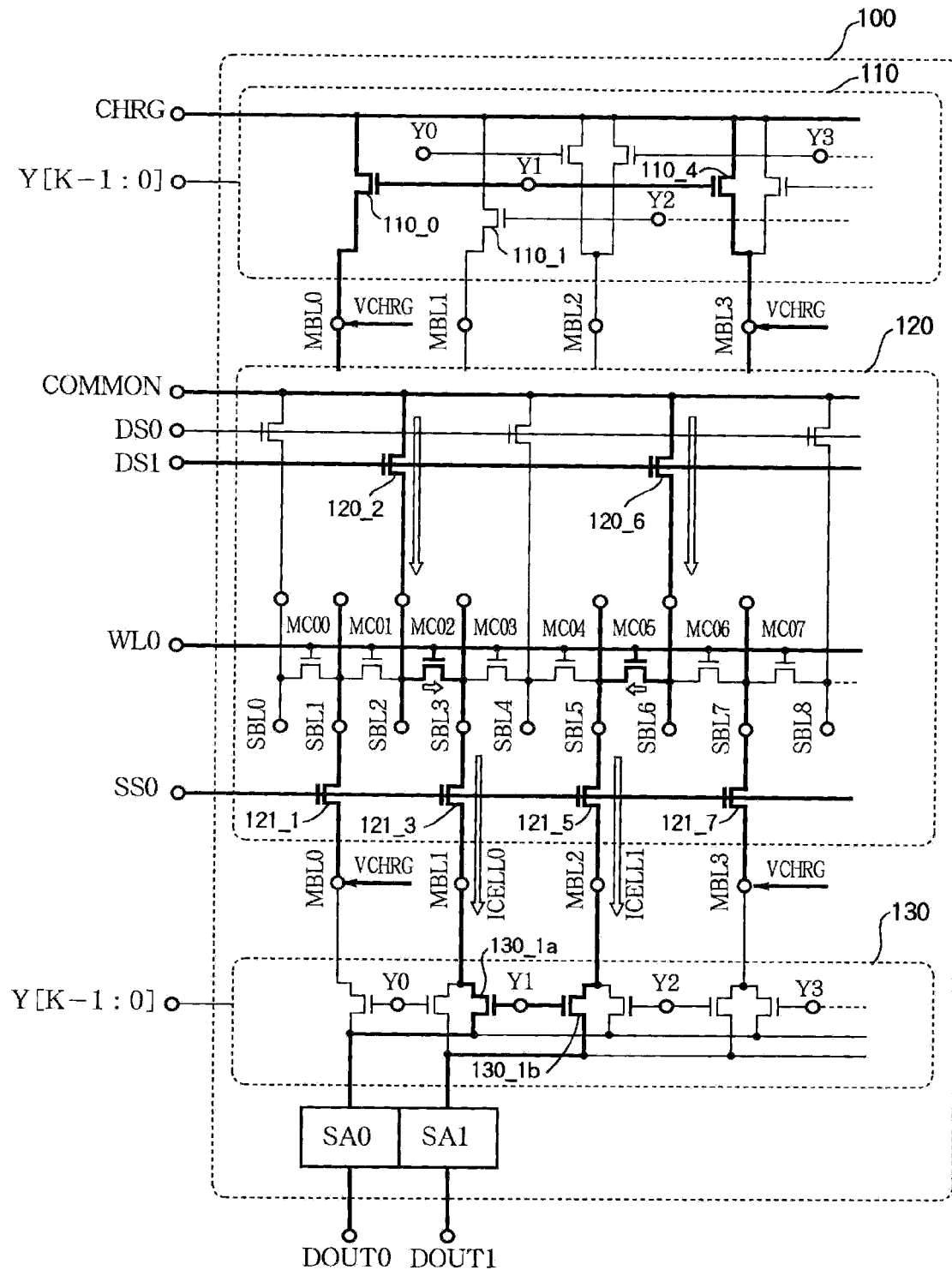
FIG. 3 is an explanatory diagram showing a data reading operation of the semiconductor memory circuit according to the first embodiment.

FIG. 3 is an explanatory diagram of data reading operation of the semiconductor memory circuit 100 according to the first embodiment. Referring now to FIG. 3, the data reading operation of the semiconductor memory circuit 100 will be described. In this description, a case of selecting the memory cells MC02 and MC05 is provided.

Selecting the word line WL0 in the memory cell array 120, the memory cells MC00, . . . , MC07 in the row that includes the memory cells MC02 and MC05 are electrically connected. Selecting the sub bit line selection signal DS1, the common voltage source COMMON connects to one diffusion layer of the memory cell MC02 via the transistor 120_2 and the sub bit line SBL2, and the common voltage source COMMON connects to one diffusion layer of the memory cell MC05 via the transistor 120_6 and the sub bit line SBL6.

Selecting the sub bit selection signal SS0, the main bit line MBL1 connects to the other diffusion layer of the memory cell MC02 via the transistor 121_3 and the sub bit line SBL3, and the main bit line MBL2 connects to the other diffusion layer of the memory cell MC05 via the transistor 121_5 and the sub bit line SBL5. Selecting the main bit line selection signal Y1 in the first multiplexer 130, the main bit line MBL1 connects to the sense amplifier SA0 via the transistor 130_1a, and the main bit line MBL2 connects to the sense amplifier SA1 via the transistor 130_1b.

With this operation, the memory cells MC02 and MC05 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the αth (α=0, 1, 2, . . . , M−1) sub bit selection signal SSα and the main bit selection signals Y (2n−2) with even numbers (where n=1, 2, . . . ), the (α×2+0)th sub bit line selection signal DS (α×2) is selected, and in case of selecting the main bit line selection signal Y(2n−1) with odd numbers, the (α×2+1)th sub bit line selection signal DS (α×2+1) is selected.

Selecting the main bit line selection signal Ym (where m=0, 1, . . . , K−1) in the second multiplexer 110, the charging/discharging voltage source CHRG connects to the main bit lines MBL(m−1) and MBL(m+2). For example, selecting the main bit line signal Y1 in the second multiplexer 110, the charging/discharging voltage source CHRG connects to the main bit line MBL0 via the transistor 110_0 and the charging/discharging voltage source CHRG connects to the MBL3 via the transistor 110_4.

Selecting the sub bit line selection signal SS0 in the memory cell array 120, the main bit line MBL0 connects to the sub bit line SBL1 via the transistor 121_1, and the main bit line MBL3 connects to the sub bit line SBL7 via the transistor 121_7. With this operation, the main bit lines MBL0 and MBL3, sub bit lines SBL1 and SBL7 are set to have the supply voltage value VCHRG of the charging/discharging voltage source CHRG.

As described above, the semiconductor memory circuit 100 according to the first embodiment employs the circuit configuration, in which a pair of adjacent main bit lines (e.g. MBL1 and MBL2) is selected similarly to the conventional semiconductor memory circuit 1000 and the respective main bit lines connect to sense amplifiers SA0 and SA1. Accordingly, in the semiconductor memory circuit 100 of the first embodiment, it is possible to reduce the influences among the main bit lines MBL2 and MBL1, sub bit lines SBL5 and SBL3, and sub bit line SBL4 similarly to the conventional semiconductor memory circuit 1000.

Furthermore, in the semiconductor memory circuit 100 of the first embodiment, the voltages of the main bit lines MBL0 and MBL3 are set to the value VCHRG by the second multiplexer 110. With this setting, in the semiconductor memory circuit 100 of the first embodiment, it is possible to achieve a circuit that can reduce the voltage fluctuation of the main bit lines that are adjacently provided outside the pair of selected adjacent main bit lines (e.g. the main bit line MBL0 that is adjacently outside the main bit line MBL1 and the main bit line MBL3 that is adjacently outside the main bit line MBL2).

Therefore, according to the semiconductor memory circuit 100 of the first embodiment, the sense amplifiers SA0 and SA1 can precisely detect the original current of the memory cell to read.

Second Embodiment

Figure 4:
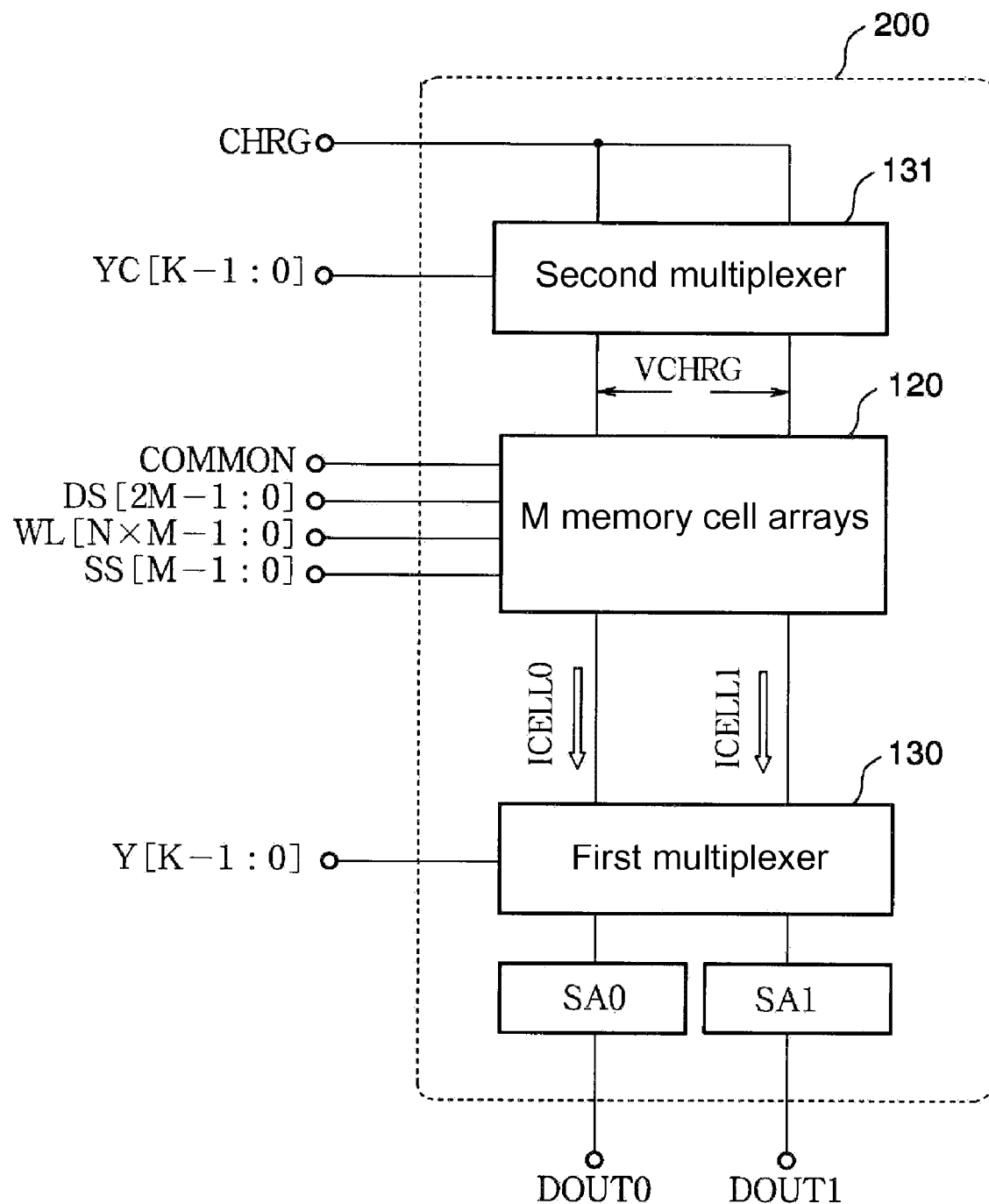
FIG. 4 is a block diagram schematically showing the semiconductor memory circuit according to a second embodiment of the invention.
Figure 5:
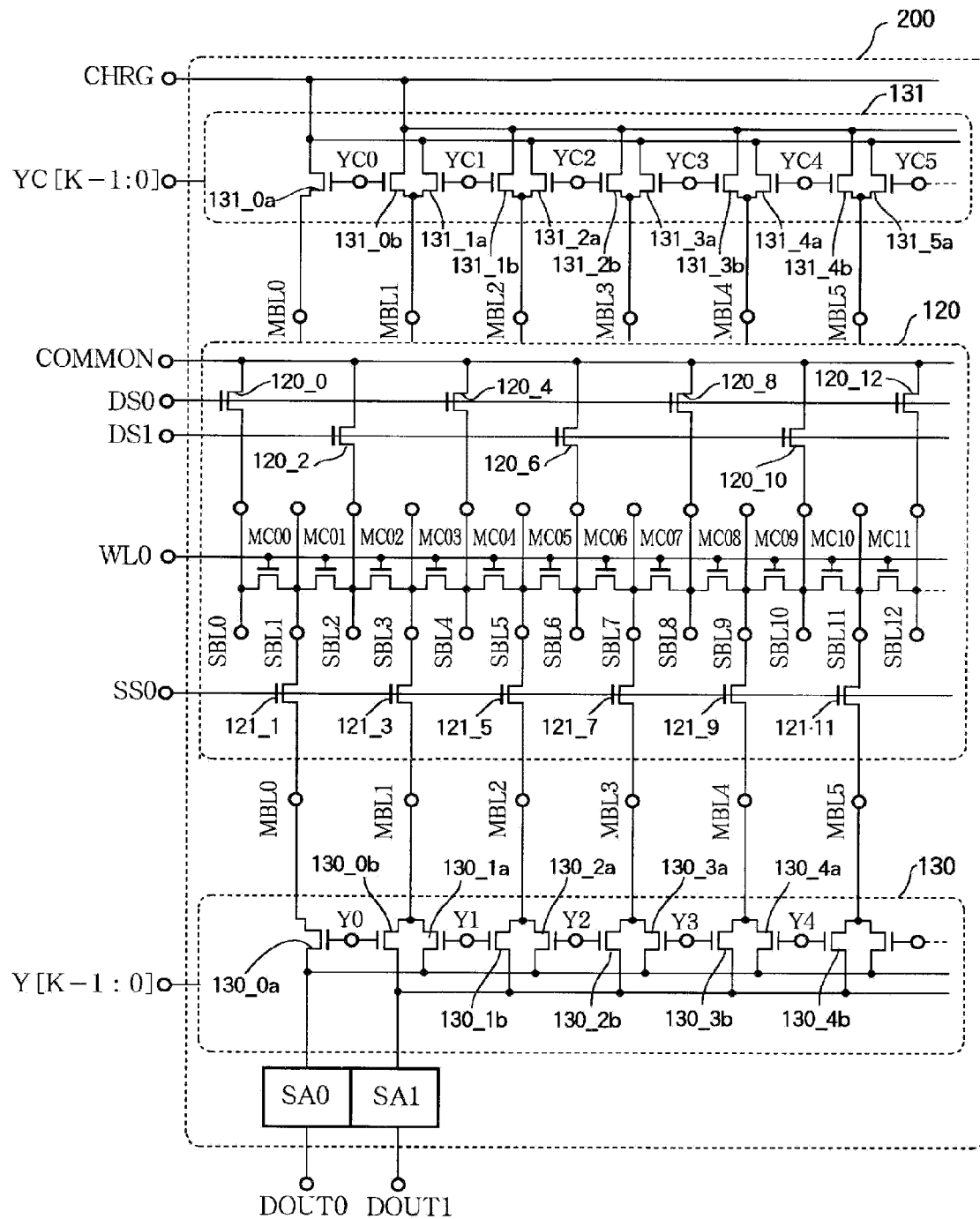
FIG. 5 is a circuit diagram including the second multiplexer, the memory cell array, and the first multiplexer of the semiconductor memory circuit according to the second embodiment.

A second embodiment of the present invention will be explained next. FIG. 4 is a block diagram schematically showing the configuration of a semiconductor memory circuit 200 according to the second embodiment of the invention. FIG. 5 is a circuit diagram including a second multiplexer 131, memory cell array 120, and a first multiplexer 130 of the semiconductor memory circuit 200 according to the second embodiment.

As shown in FIGS. 4 and 5, the semiconductor memory circuit 200 of the second embodiment includes the second multiplexer 131, which includes a plurality of transistors (e.g. transistors 131_0a, 131_0b, 131-1a, 131_1b, 131_2a, 131_2b, . . . ); M memory cell arrays 120, which include a plurality of memory cells (e.g. MC00, . . . , MC07) aligned in rows and columns; the first multiplexer 130, which includes a plurality of transistors (e.g. transistors 130_0a, 130_0b, 130_1a, 130_1b, 130_2a, 130_2b, . . . ); and the sense amplifiers SA0 and SA1.

The second multiplexer 131 has the same configuration as that of the first multiplexer 130. Y[K−1:0] are main bit selection signals applied to control terminals of the transistors (the transistors 130_0a, 130_0b, 130_1a, 130_ab, . . . in the configuration 130 of FIG. 5) between the sense amplifiers SA0 and SA1 and the main bit lines. YC[K−1:0] are main bit line selection signals to input into control terminals of the transistors (the transistors 131_0a, 131_0b, 131_1a, 131__b, . . . in the configuration 131 of FIG. 5) connected between the charging/discharging voltage source CHRG and the main bit lines MBL0, MBL1, . . . and to select a main bit line that connects to the charging/discharging voltage source CHRG. Other configurations of the semiconductor memory circuit 200 according to the second embodiment are similar to those of the semiconductor memory circuit 100 according to the first embodiment.

SBL[12:0] are sub bit lines, and MBL[5:0] are main bit lines. The main bit lines MBL[5:0] connect to M memory cell arrays 120, but only one memory cell array 120 is shown in FIG. 5. In FIG. 5, only word line WL0, which is one of the word lines connected to the M memory cell arrays, is shown. Here, each signal that is inputted to the semiconductor memory circuit 200 is inputted from a circuit (not illustrated) that controls the operation of the semiconductor memory circuit 200.

Figure 6:
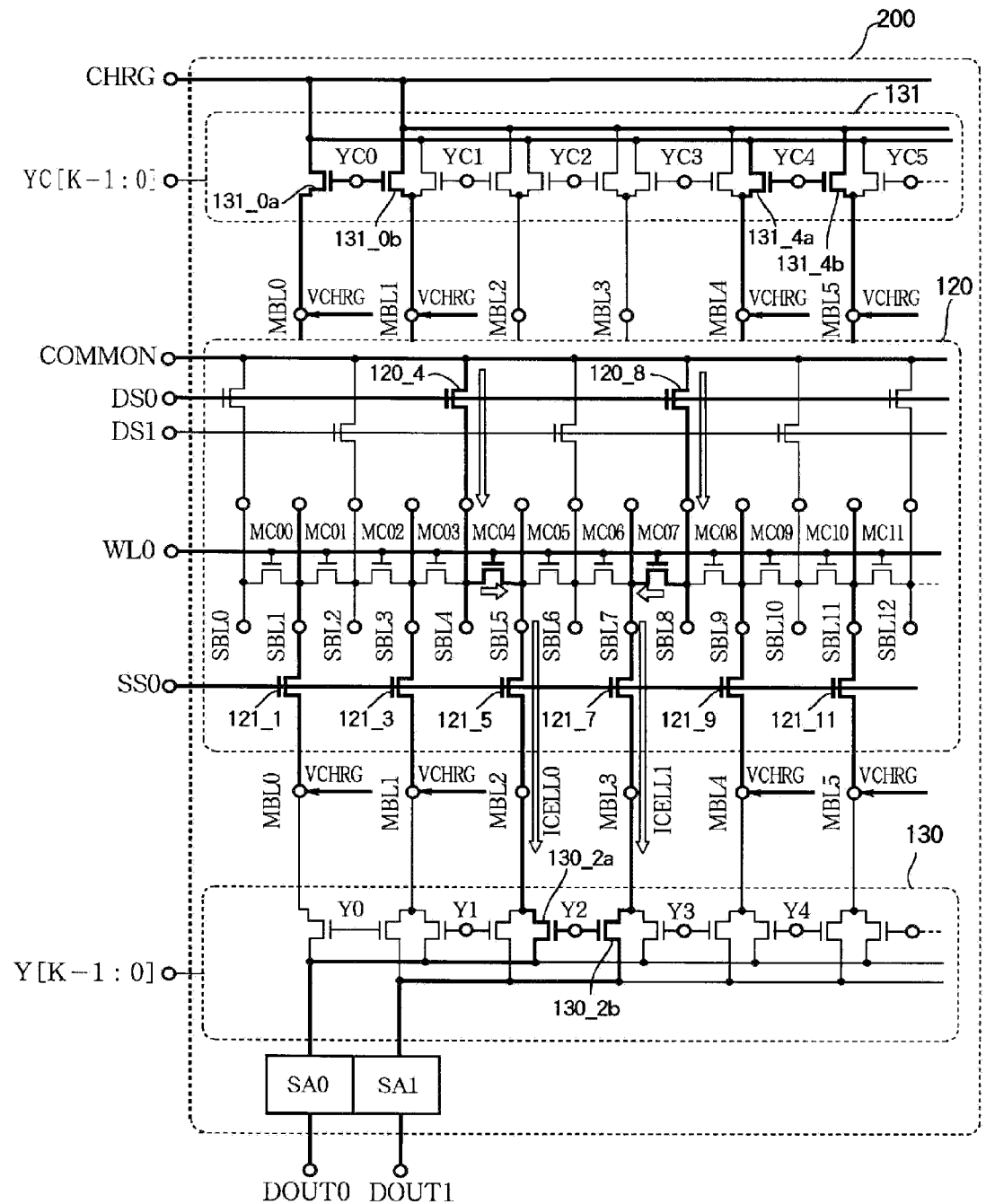
FIG. 6 is an explanatory diagram of the data reading operation of the semiconductor memory circuit according to the second embodiment.

FIG. 6 is an explanatory diagram of data reading operation of the semiconductor memory circuit 200 according to the second embodiment. Referring now to FIG. 6, the data reading operation of the semiconductor memory circuit 200 will be described. In this description, a case of selecting the memory cells MC04 and MC07 is provided.

Selecting the word line WL0 in the memory cell array 120, the memory cells MC00, . . . , MC07 in the row including the memory cells MC04 and MC07 are electrically connected. Selecting the sub bit line selection signal DS0, the common voltage source COMMON connects to one diffusion layer of the memory cell MC04 via the transistor 120_4 and the sub bit line SBL4, and the common voltage source COMMON is connected to one diffusion layer of the memory cell MC08 via the transistor 120_8 and the sub bit line SBL8.

Selecting the sub bit selection signal SS0, the main bit line MBL2 connects to the other diffusion layer of the memory cell MC04 via the transistor 121_5 and the sub bit line SBL5, and the main bit line MBL3 connects to the other diffusion layer of the memory cell MC07 via the transistor 121_7 and the sub bit line SBL7. Selecting the main bit line selection signal Y2 in the first multiplexer 130, the main bit line MBL2 connects to the sense amplifier SA0 via the transistor 130_2a, and the main bit line MBL3 connects to the sense amplifier SA1 via the transistor 130_2b.

With this operation, the memory cells MC04 and MC07 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the uth ($\alpha$=0, 1, 2, . . . , M−1) sub bit selection signal Su and the main bit selection signals Y (2n−2) with even numbers (where n=1, 2, . . . ), the ($\alpha \times 2$+0)th sub bit line selection signal DS($\alpha \times 2$) is selected, and in case of selecting the main bit line selection signal Y(2n−1) with odd numbers, the ($\alpha \times 2$+1)th sub bit line selection signal DS ($\alpha \times 2$+1) is selected.

In the second multiplexer 131, the main bit line selection signals YCm and YC(m+4) (where m=1, 2, . . . ) are selected. Selecting the main bit line section signal YCm, the charging/discharging voltage source CHRG connects to the main bit lines MBLm and MBL(m+1). In addition, selecting the main bit selection signal YC(m+4), the charging/discharging voltage source CHRG connects to the main bit lines MBL(m+4) and MBL(m+5). For example, selecting the main bit line signal YC0 in the second multiplexer 131, the charging/discharging voltage source CHRG connects to the main bit lines MBL0 and MBL1 via the transistors 131_0a and 131_0b. In addition, selecting the main bit line selection signal YC4, the charging/discharging voltage source CHRG connects to the main bit lines MBL4 and MBL5 via the transistors 131_4a and 131_4b.

Selecting the sub bit line selection signal SS0 in the memory cell array 120, the main bit lines MBL0, MBL1, MBL4, and MBL5 connect to the sub bit lines SBL1, SBL3, SBL9, and SBL11 via the transistors 121_1, 121_3, 121_9, and 121_11. With this operation, the main bit lines MBL0, MBL1, MBL4, and MBL5, and voltages of the sub bit lines SBL1, SBL3, SBL9, and SBL11 are set to the supply voltage value VCHRG.

Here, in case of selecting γth main bit signal selection signal Yγ (where γ=0, 1, 2, . . . , K−1), γ±2 main bit line selection signals YC(γ−2) and YC(γ±2) are selected. Here, in case of γ−2<0, the (γ−2+K)th main bit line selection signal YC is selected. In case of γ+2>K−1, the (γ+2−K)th main bit line selection signal YC is selected.

As described above, the semiconductor memory circuit 200 according to the second embodiment employs the circuit configuration, in which a pair of adjacent main bit lines (e.g. MBL2 and MBL3) is selected similarly to the semiconductor memory circuit 100 of the first embodiment and the respective main bit lines connect to sense amplifiers SA0 and SA1. Accordingly, in the semiconductor memory circuit 200 of the second embodiment, it is possible to reduce the influences among the main bit lines MBL2 and MBL3, the sub bit lines SBL5 and SBL7, and the sub bit lines SBL6 similarly to the conventional semiconductor memory circuit 1000.

Furthermore, being different from the semiconductor memory circuit 100 of the first embodiment, the semiconductor memory circuit 200 of the second embodiment uses the second multiplexer 131 for selecting a main bit line to connect to the charging/discharging voltage source CHRG. In the semiconductor memory circuit 200 of the second embodiment, the voltages of the main bit lines MBL0, MBL1, MBL4, and MBL5 are set to the value VCHRG by the second multiplexer 131.

With this setting, in the semiconductor memory circuit 200 of the second embodiment, it is possible to achieve a circuit that can reduce the voltage fluctuation of main bit lines that are adjacently provided outside the pair of selected adjacent main bit lines (e.g. the main bit lines MBL1 and MBL0 that are provided outside the main bit line MBL2, and the main bit lines MBL4 and MBL5 that are adjacently provided outside the main bit line MBL3).

Therefore, according to the semiconductor memory circuit 200 of the second embodiment, the sense amplifiers SA0 and SA1 can precisely detect the original current of the memory cell to read.

Furthermore, according to the semiconductor memory circuit 200 of the second embodiment, since the second multiplexer 131 can employ a circuit with the same configuration as that of the first multiplexer 130, it is possible to make the circuit production more efficient.

Moreover, the semiconductor memory circuit 200 of the second embodiment may already include a circuit that is equivalent to the second multiplexer 131 for selecting a main bit line upon writing. In this case, since it is possible to share the multiplexer simply by switching the control signals, it is possible to reduce the size of the circuit.

Third Embodiment

Figure 7:
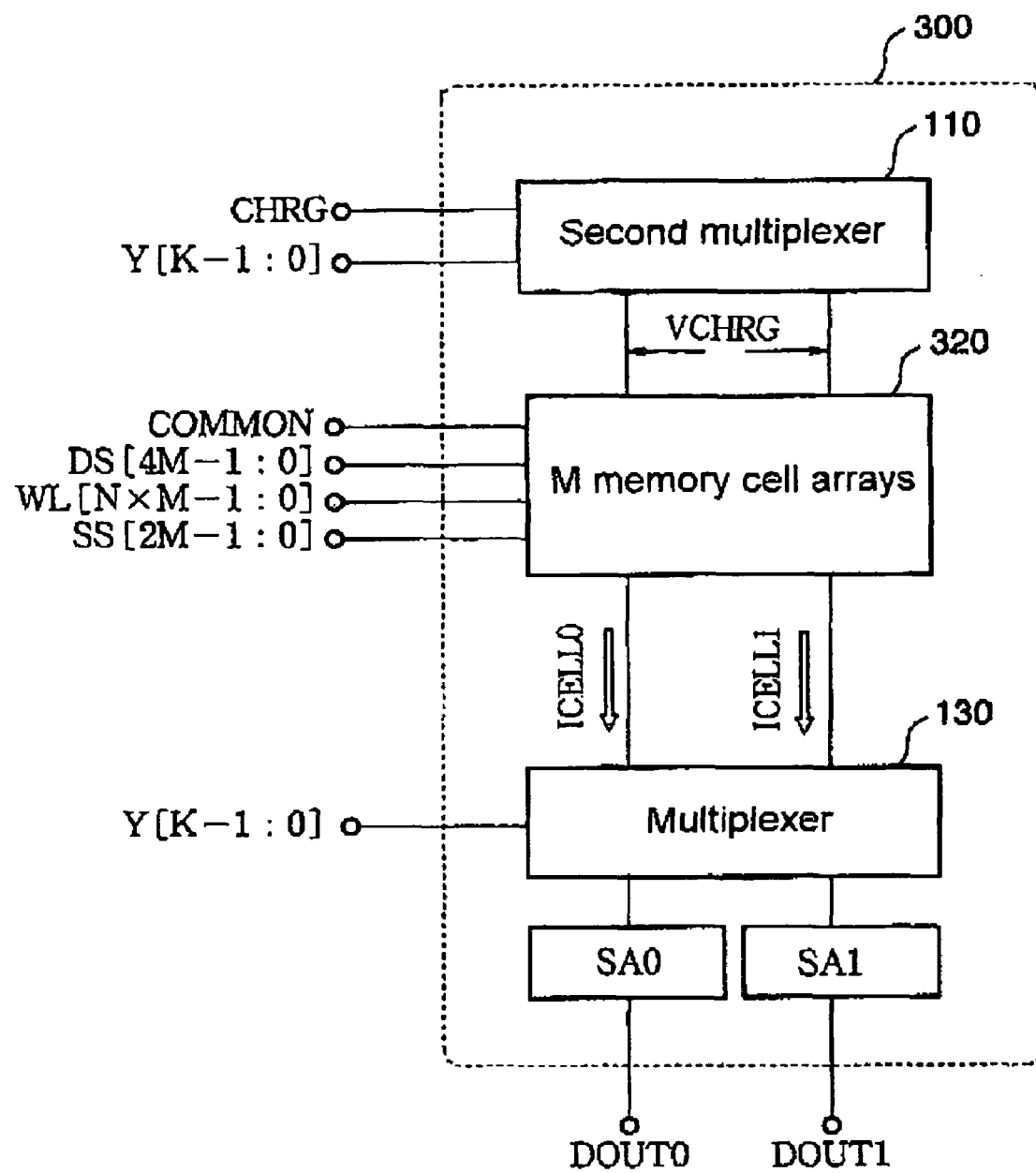
FIG. 7 is a block diagram schematically showing configuration of the semiconductor memory circuit according to a third embodiment.
Figure 8:
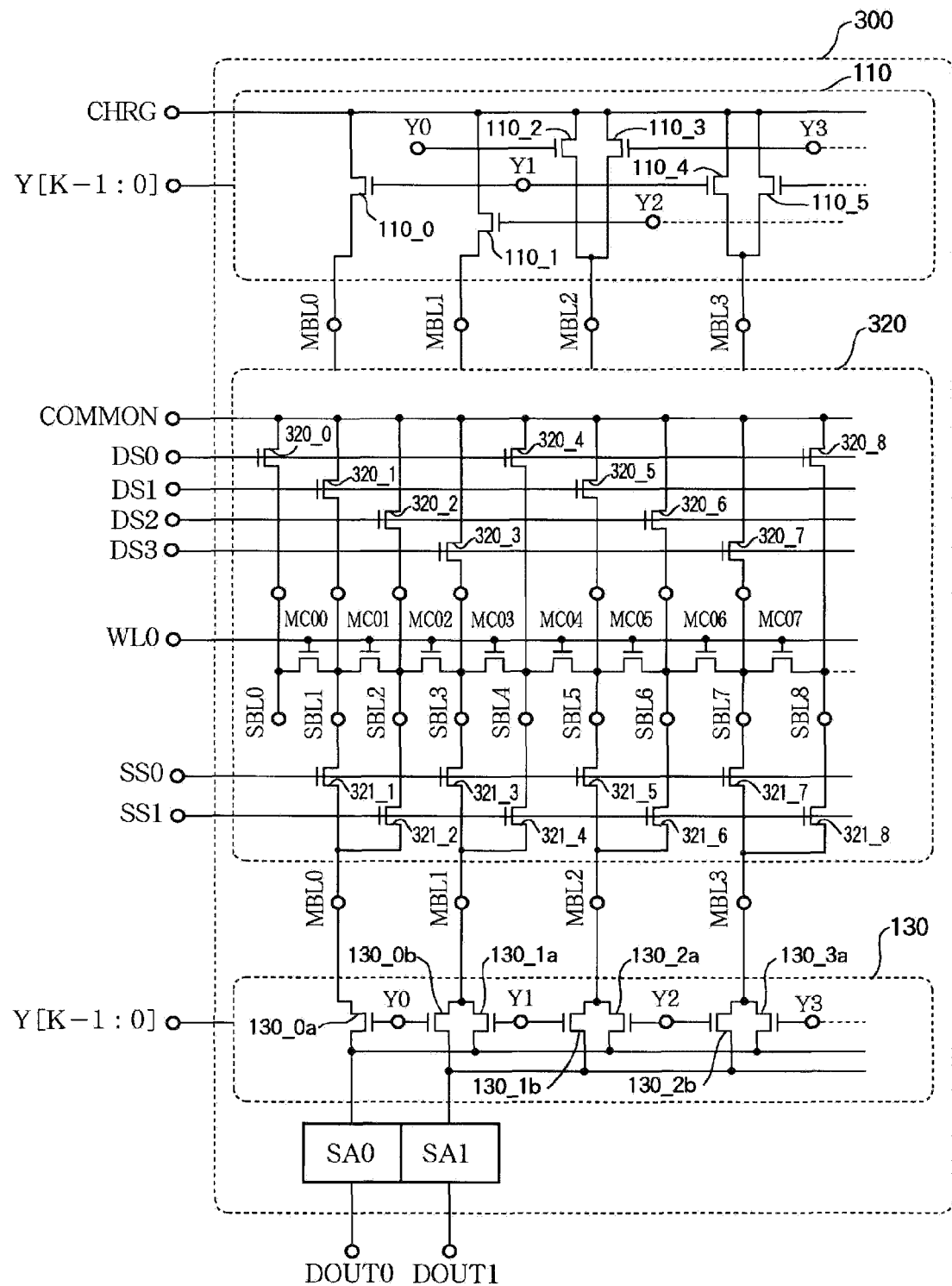
FIG. 8 is a circuit diagram including the second multiplexer, the memory cell array, and the first multiplexer of the semiconductor memory circuit according to the third embodiment.

A third embodiment of the present invention will be explained next. FIG. 7 is a block diagram schematically showing the configuration of a semiconductor memory circuit 300 according to the third embodiment of the invention. FIG. 8 is a circuit diagram including the second multiplexer 110, a memory cell array 320, and the first multiplexer 130 of the semiconductor memory circuit 300 according to the third embodiment.

As shown in FIGS. 7 and 8, the semiconductor memory circuit 300 of the third embodiment includes the second multiplexer 110, which includes a plurality of transistors (e.g. transistors 110_0, 110_1, 110_2, 110_3, 110_4, 110_5, . . . ); M memory cell arrays 320, which include a plurality of memory cells (e.g. MC00, . . . , MC07) aligned in rows and columns; the first multiplexer 130, which includes a plurality of transistors (e.g. transistors 130_0a, 130_0b, 130_1a, 130_1b, 130_2a, 130_2b, . . . ); and sense amplifiers SA0 and SA1.

The memory cell array 320 includes a multi bit type memory cell in the configuration. The multi bit type memory cell can output different data by changing the direction of the current. DS[4M−1:0] are sub bit line selection signals applied to control terminals of transistors (transistors 320_1, 320_2, 320_3, 320_4, . . . are shown in FIG. 8) between the common voltage source COMMON and sub bit line. SS[2M−1] are sub bit line selection signals applied to control terminals of the transistors (transistors 321_1, 321_2, 321_3, 321_4, . . . are shown in FIG. 8) between the main bit lines and the sub bit lines. Other configurations of the semiconductor circuit 300 of the third embodiment are similar to those of the semiconductor memory circuit 100 of the first embodiment.

SBL[8:0] are sub bit lines, and MBL[3:0] are main bit lines. The main bit lines MBL[3:0] connect to M memory cell arrays 320, but only one memory cell array 320 is shown in FIG. 8. In FIG. 8, only word line WL0, which is one of the word lines connected to the M memory cell arrays, is shown. In addition, each signal that is input to the semiconductor memory circuit 300 is input from a circuit (not illustrated) that controls the operation of the semiconductor memory circuit 300.

Figure 9:
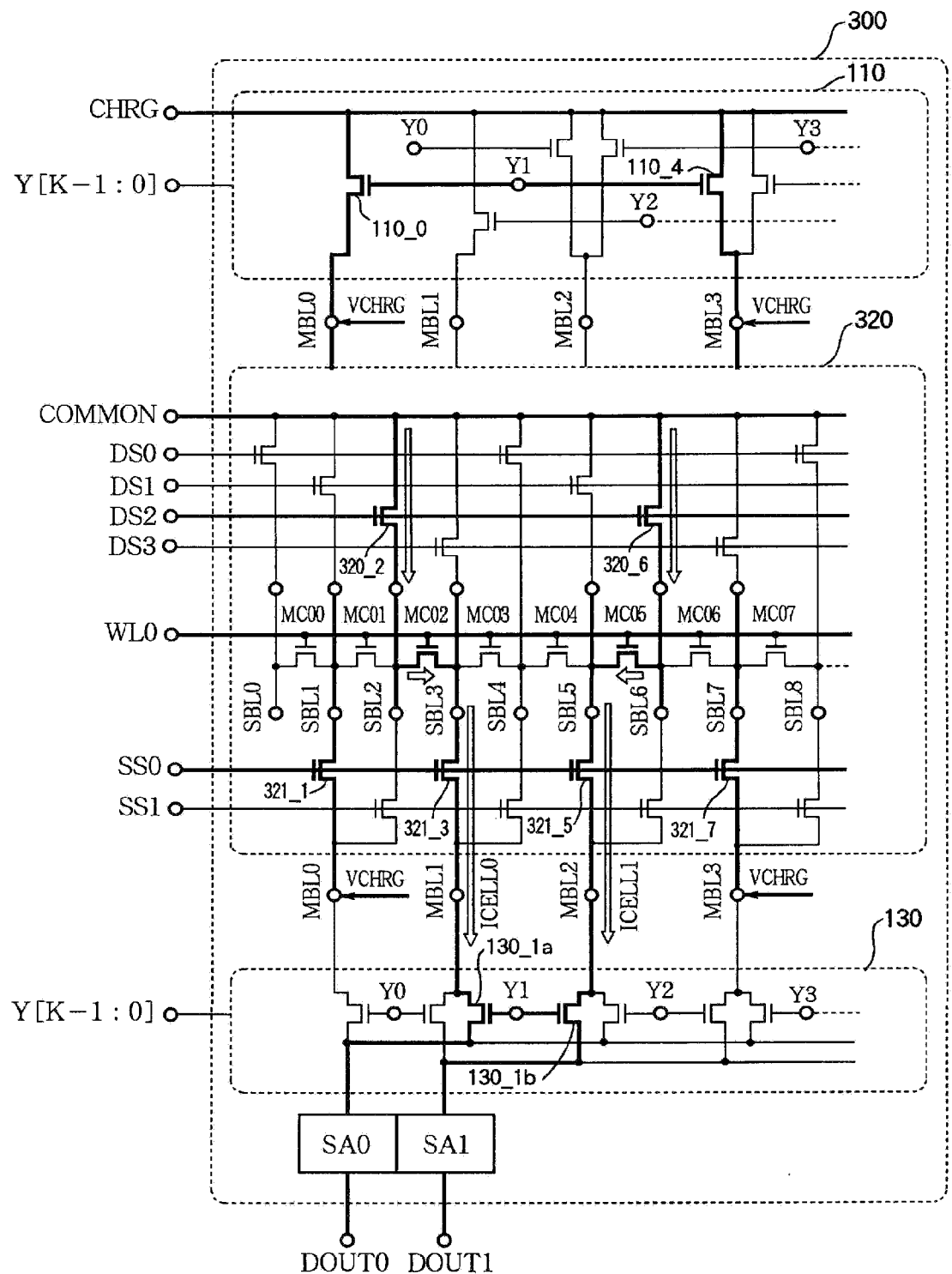
FIG. 9 is an explanatory diagram of the data reading operation of the semiconductor memory circuit according to the third embodiment.

FIG. 9 is an explanatory diagram of data reading operation of the semiconductor memory circuit 300 according to the third embodiment. Referring now to FIG. 9, the data reading operation of the semiconductor memory circuit 300 will be described. In this description, a case of selecting the memory cells MC02 and MC05 is provided.

Selecting the word line WL0 in the memory cell array 320, the memory cells MC00, . . . , MC07 in the row including the memory cells MC02 and MC05 are electrically connected. Selecting the sub bit line selection signal DS2, the common voltage source COMMON connects to one diffusion layer of the memory cell MC02 via the transistor 320_2 and the sub bit line SBL2, and the common voltage source COMMON is connected to one diffusion layer of the memory cell MC05 via the transistor 320_6 and the sub bit line SBL6.

Selecting the sub bit selection signal SS0, the main bit line MBL1 connects to the other diffusion layer of the memory cell MC02 via the transistor 321_3 and the sub bit line SBL3, and the main bit line MBL2 connects to the other diffusion layer of the memory cell MC05 via the transistor 321_5 and the sub bit line SBL5. Selecting the main bit line selection signal Y1 in the first multiplexer 130, the main bit line MBL1 connects to the sense amplifier SA0 via the transistor 130_1a, and the main bit line MBL2 connects to the sense amplifier SA1 via the transistor 130_1b.

With this operation, the memory cells MC02 and MC05 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the $(2\alpha+\beta)$th ($\alpha$=0, 1, 2, ..., M−1, $\beta$=0, 1) sub bit selection signal SS$(2\alpha+\beta)$ and the main bit selection signals Y (2n−2) with even numbers (where n=1, 2, ...), the $((\alpha\times2+0)\times2+\beta)$th sub bit line selection signal DS$((\alpha\times0)\times2+\beta)$ is selected, and in case of selecting the main bit line selection signal Y(2n−1) with odd numbers, the $((\alpha\times2+1)\times2+\beta)$th sub bit line selection signal DS$((\alpha\times2+1)\times2+\beta)$ is selected.

Selecting the main bit line selection signal Ym (where m=0, 1, ..., K−1) in the second multiplexer 110, the charging/discharging voltage source CHRG connects to the main bit lines MBL(m−1) and MBL(m+2). For example, selecting the main bit line signal Y1 in the second multiplexer 110, the charging/discharging voltage source CHRG connects to the main bit line MBL0 via the transistor 110_0 and the charging/discharging voltage source CHRG connects to the MBL3 via the transistor 110_4.

Selecting the sub bit line selection signal SS0 in the memory cell array 320, the main bit line MBL0 connects to the sub bit line SBL1 via the transistor 321_1, and the main bit line MBL3 connects to the sub bit line SBL7 via the transistor 321_7. With this operation, the main bit lines MBL0 and MBL3, sub bit lines SBL1 and SBL7 are set to the supply voltage value VCHRG of the charging/discharging voltage source CHRG.

As described above, although the semiconductor memory circuit 300 according to the third embodiment uses the memory cell array 320, similarly to the semiconductor memory circuit 100 of the first embodiment, it employs the circuit configuration, in which a pair of adjacent main bit lines (e.g. MBL1 and MBL2) is selected similarly to the semiconductor memory circuit 100 of the first embodiment and the respective main bit lines connect to sense amplifiers SA0 and SA1. Accordingly, in the semiconductor memory circuit 300 of the third embodiment, it is possible to reduce the influences among the main bit lines MBL2 and MBL1, sub bit lines SBL5 and SBL3, and the sub bit line SBL4 similarly to the conventional semiconductor memory circuit 1000.

Furthermore, in the semiconductor memory circuit 300 of the third embodiment, the voltages of the main bit lines MBL0 and MBL3 are set to the value VCHRG by the second multiplexer 110, similarly to the semiconductor memory circuit 100 of the first embodiment. With this setting, in the semiconductor memory circuit 300 of the third embodiment, it is possible to achieve a circuit that can reduce the voltage fluctuation of the main bit lines that are adjacently provided outside the pair of selected adjacent main bit lines (e.g. the main bit line MBL0 that is adjacently provided outside the main bit line MBL1 and the main bit line MBL3 that is adjacently provided outside the main bit line MBL2).

Therefore, according to the semiconductor memory circuit 300 of the third embodiment, the sense amplifiers SA0 and SA1 can precisely detect the original current of the memory cell to read.

Fourth Embodiment

Figure 10:
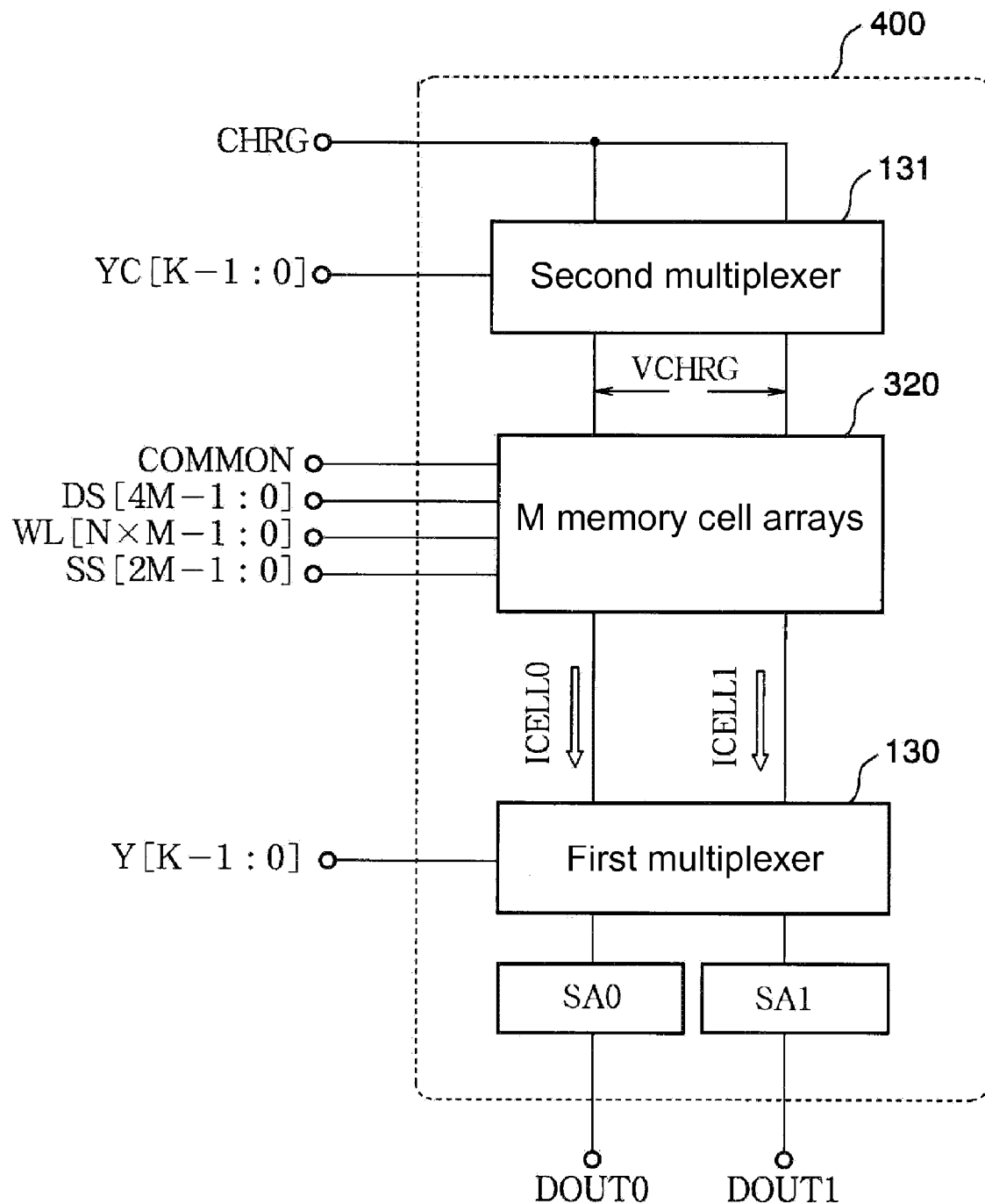
FIG. 10 is a block diagram schematically showing configuration of the semiconductor memory circuit according to a fourth embodiment.
Figure 11:
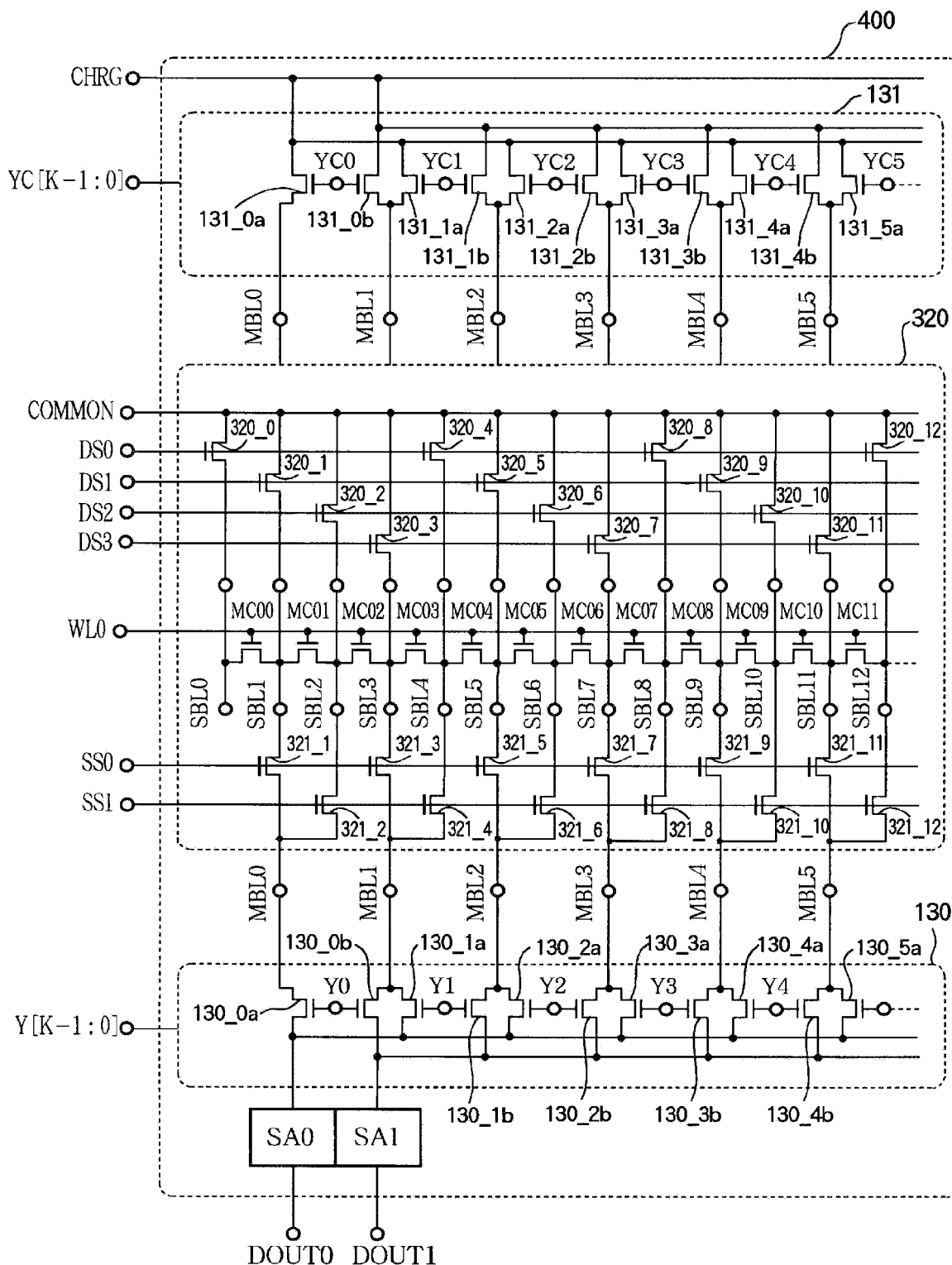
FIG. 11 is a circuit diagram including the second multiplexer, the memory cell array, and the first multiplexer of the semiconductor memory circuit according to the fourth embodiment.

A fourth embodiment of the present invention will be explained next. FIG. 10 is a block diagram schematically showing the configuration of a semiconductor memory circuit 400 according to the fourth embodiment of the invention. FIG. 11 is a circuit diagram including the second multiplexer 131, the memory cell array 320, and the first multiplexer 130 of the semiconductor memory circuit 100 according to the first embodiment.

As shown in FIGS. 10 and 11, the semiconductor memory circuit 400 of the fourth embodiment includes a second multiplexer 131, which includes a plurality of transistors (e.g. transistors 131_0a, 131_0b, 131_1a, 131_1b, 131_2a, 131_2b, ...); M memory cell arrays 320, which include a plurality of memory cells (e.g. MC00, ..., MC07) aligned in rows and columns; a first multiplexer 130, which includes a plurality of transistors (e.g. transistors 130_0a, 130_0b, 130_1a, 130_1b, 130_2a, 130_2b, ...); and sense amplifiers SA0 and SA1.

The memory cell array 320 is configured to employ multi bit type memory cells. The multi bit type bit memory cells can output different data by changing the directions of the current. DS[4M−1:0] are sub bit line selection signals to be applied to control terminals of the transistors (transistors 320_0, 320_1, 320_2, 320_3, 320_4, ... are shown in FIG. 11) between the common voltage source COMMON and the sub bit lines. SS[2M−1:0] are sub bit selection signals to be applied to the control terminals of the transistors (transistors 321_1, 321_2, 321_3, 321_4, ... are shown in FIG. 11) between the main bit lines and the sub bit lines. Other configuration of the semiconductor circuit 400 of the fourth embodiment is similar to the one of the semiconductor memory circuit 200 of the second embodiment.

SBL[12:0] are sub bit lines, and MBL[5:0] are main bit lines. The main bit lines MBL[5:0] connect to M memory cell arrays 320, but only one memory cell array 320 is shown in FIG. 11. In FIG. 11, only one word line WL0, which is one of the word lines, is shown. Here, each signal that is input to the semiconductor memory circuit 400 is input from a circuit (not illustrated) that controls the operation of the semiconductor memory circuit 400.

Figure 12:
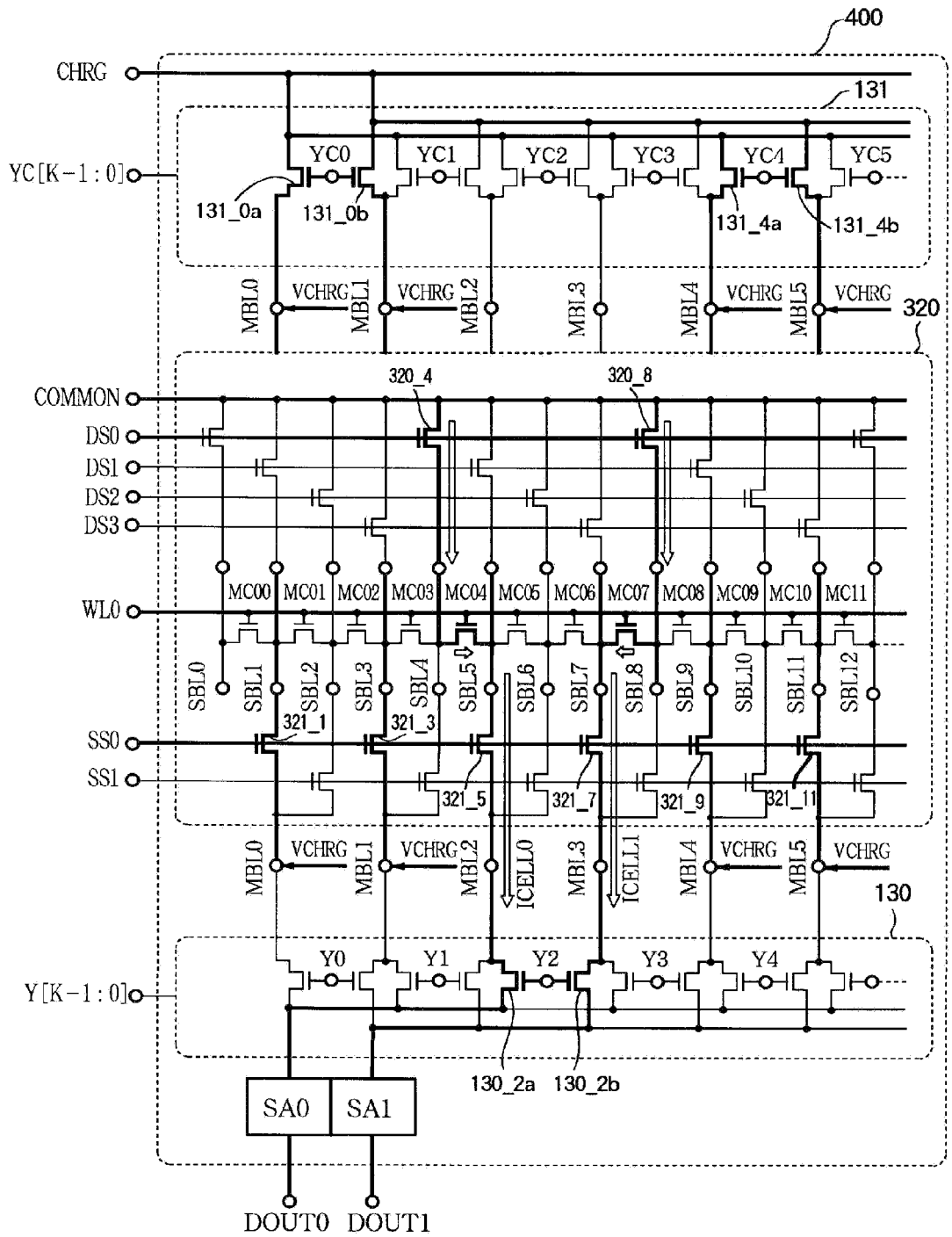
FIG. 12 is an explanatory diagram of the data reading operation of the semiconductor memory circuit according to the fourth embodiment.

FIG. 12 is an explanatory diagram of data reading operation of the semiconductor memory circuit 400 according to the fourth embodiment. Referring now to FIG. 12, the data reading operation of the semiconductor memory circuit 400 will be described. In this description, a case of selecting the memory cells MC04 and MC07 is provided.

Selecting the word line WL0 in the memory cell array 320, the memory cells MC00, ..., MC11 in the row that includes the memory cells MC04 and MC07 are electrically connected. Selecting the sub bit line selection signal DS0, the common voltage source COMMON connects to one diffusion layer of the memory cell MC04 via the transistor 320_4 and the sub bit line SBL4, and the common voltage source COMMON connects to one diffusion layer of the memory cell MC08 via the transistor 320_8 and the sub bit line SBL8.

Selecting the sub bit selection signal SS0, the main bit line MBL2 connects to the other diffusion layer of the memory cell MC04 via the transistor 321_5 and the sub bit line SBL5, and the main bit line MBL3 connects to the other diffusion layer of the memory cell MC07 via the transistor 321_7 and the sub bit line SBL7. Selecting the main bit line selection signal Y2 in the first multiplexer 130, the main bit line MBL2 connects to the sense amplifier SA0 via the transistor 130_2a, and the main bit line MBL3 connects to the sense amplifier SA1 via the transistor 130_2b.

With this operation, the memory cells MC04 and MC07 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the $(2\alpha+\beta)$th ($\alpha$=0, 1, 2, ..., M−1, $\beta$=0, 1) sub bit selection signal SS($2\alpha+\beta$) and the main bit selection signals Y ($2n$−2) with even numbers (where n=1, 2, ...), the $((\alpha\times2+0)\times2+\beta)$th sub bit line selection signal DS$((\alpha\times2+0)\times2+\beta)$ is selected, and in case of selecting the main bit line selection signal Y($2n$−1) with odd numbers, the $((\alpha\times2+1)\times2+\beta)$th sub bit line selection signal DS$((\alpha\times2+1)\times2+\beta)$ is selected.

Selecting the main bit line selection signal YCp (where p=0, 1, 2, ..., K−1) in the second multiplexer 131, the charging/discharging voltage source CHRG connects to the main bit lines MBLp and MBL(p+1). In addition, selecting the main bit line selection signal YC(p+4) in the second multiplexer 131, the charging/discharging voltage source CHRG connects to the main bit lines MBL(p+4) and MBL(p+5). For example, selecting the main bit line signal YC0 in the second multiplexer 131, the charging/discharging voltage source CHRG connects to the main bit lines MBL0 and MBL1 via the transistors 131_0a and 131_0b. Moreover, selecting the main bit line selection signal YC4, the charging/discharging voltage source CHRG connects to the main bit lines MBL4 and MBL5 via the transistors 131_4a and 131_4b.

Selecting the sub bit line selection signal SS0 in the memory cell array 320, the main bit lines MBL0, MBL1, MBL4, and MBL5 connect to the sub bit lines SBL1, SBL3, SBL9, and SBL11 via the transistors 321_1, 321_3, 321_9, and 321_11. With this operation, the voltages of the main bit lines MBL0, MBL1, MBL4, and MBL5, and the sub bit lines SBL1, SBL3, SBL9, and SBL11 are set to the value VCHRG.

Here, in case of selecting the $\gamma$th ($\gamma$=0, 1, 2, ..., K−1) main bit line selection signal Y$\gamma$, $\gamma\pm2$ main bit line selection signals YC($\gamma$−2) and YC($\gamma$+2) are selected. However, if $\gamma$−2<0, the ($\gamma$−2+K)th main bit line selection signal YC is selected. If $\gamma$+2>K−1, the ($\gamma$+2−K)th main bit selection signal YC is selected.

As described above, although the semiconductor memory circuit 400 according to the fourth embodiment uses the memory cell array 320, similarly to the semiconductor memory circuit 200 of the second embodiment, it employs the circuit configuration, in which a pair of adjacent main bit lines is selected and the respective main bit line connect to the sense amplifiers SA0 and SA1. Accordingly, in the semiconductor memory circuit 400 of the fourth embodiment, it is possible to reduce the influences among the main bit lines MBL2 and MBL3, the sub bit lines SBL5 and SBL7, and sub bit line SBL6 similarly to the conventional semiconductor memory circuit 1000.

Furthermore, being different from the semiconductor memory circuit 300 of the third embodiment, the semiconductor memory circuit 400 of the fourth embodiment employs the second multiplexer 131 for selecting a main bit line to connect to the charging/discharging voltage source CHRG.

Similarly to the semiconductor memory circuit 200 of the second embodiment, in the semiconductor memory circuit 400 of the fourth embodiment, the voltages of the main bit lines MBL0, MBL1, MBL4, and MBL5 are set to the value VCHRG. With this setting, in the semiconductor memory circuit 400 of the fourth embodiment, it is possible to achieve a circuit that can reduce the voltage fluctuation of main bit lines that are adjacently provided outside the pair of selected adjacent main bit lines (e.g. the main bit lines MBL1 and MBL0 that are adjacently provided outside the main bit line MBL2 and the main bit lines MBL4 and MBL5 that are adjacently provided outside the main bit line MBL3).

Therefore, according to the semiconductor memory circuit 400 of the fourth embodiment, the sense amplifiers SA0 and SA1 can precisely detect the original current of the memory cell to read.

In addition, using the second multiplexer 131, the semiconductor memory circuit 400 of the fourth embodiment can achieve the efficient circuit production and reduction of the circuit side equivalently to the case of the semiconductor memory circuit 200 of the second embodiment.

Fifth Embodiment

Figure 13:
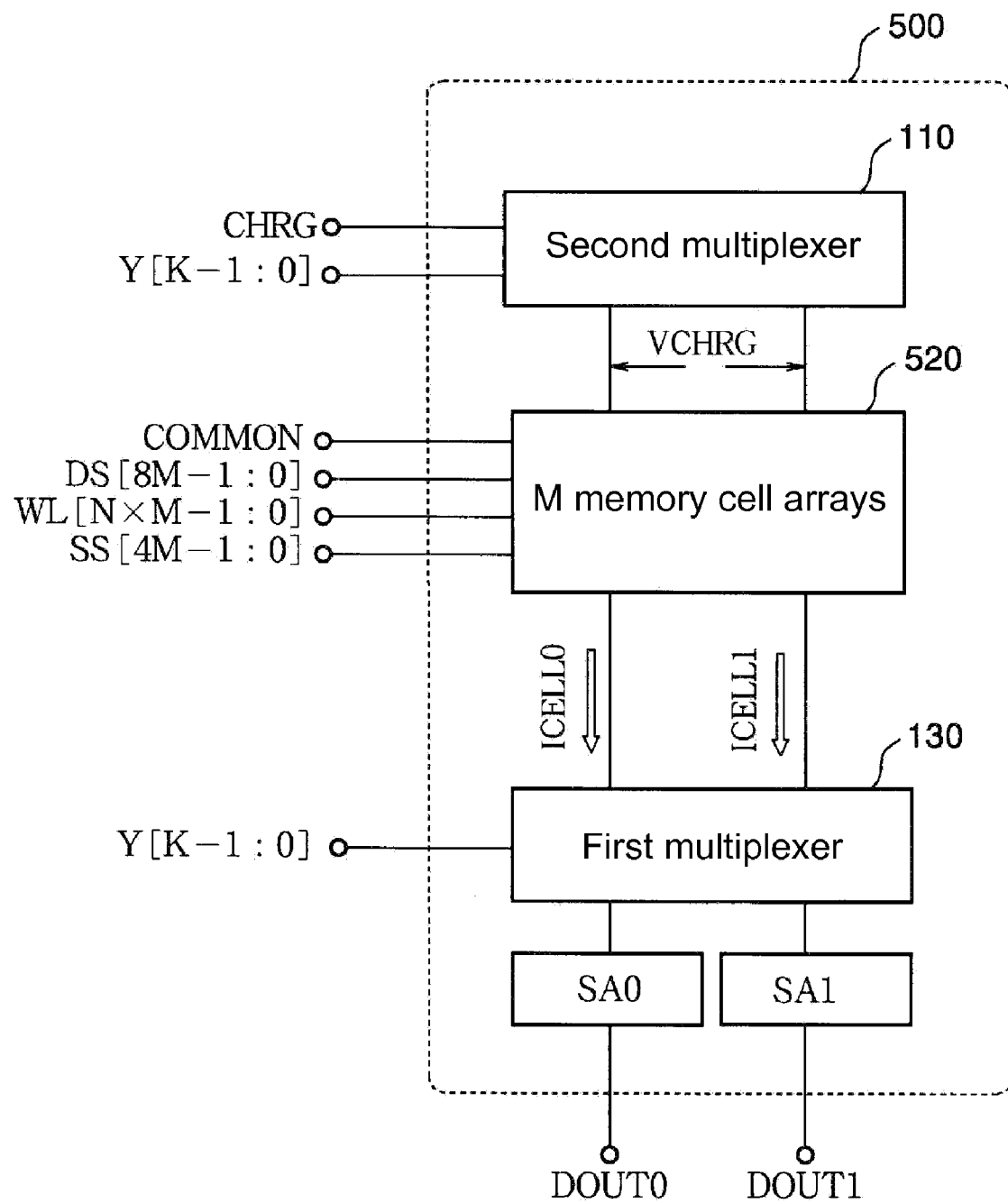
FIG. 13 is a block diagram schematically showing configuration of the semiconductor memory circuit according to a fifth embodiment.
Figure 14:
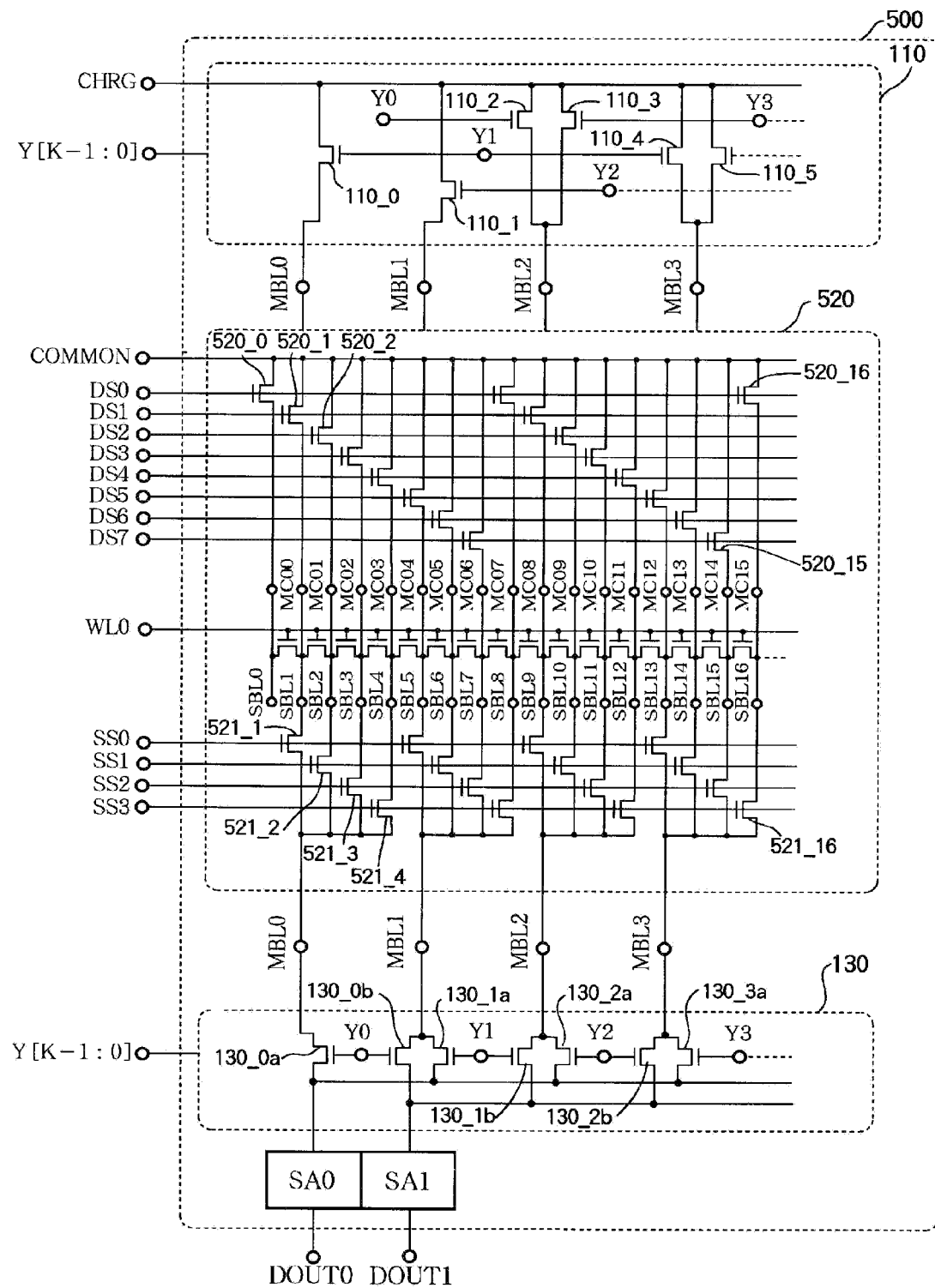
FIG. 14 is a circuit diagram including the second multiplexer, the memory cell array, and the first multiplexer of the semiconductor memory circuit according to the fifth embodiment.

A fifth embodiment of the present invention will be explained next. FIG. 13 is a block diagram schematically showing the configuration of a semiconductor memory circuit 500 according to the fifth embodiment of the invention. FIG. 14 is a circuit diagram including the second multiplexer 110, a memory cell array 520, and the first multiplexer 130 of the semiconductor memory circuit 500 according to the fifth embodiment.

As shown in FIGS. 13 and 14, the semiconductor memory circuit 500 of the fifth embodiment includes the second multiplexer 110, which includes a plurality of transistors (e.g. transistors 110_0, 110_1, 110_2, 110_3, 110_4, 110_5, ...); M memory cell arrays 520, which include a plurality of memory cells (e.g. MC00, ..., MC07) aligned in rows and columns; the first multiplexer 130, which includes a plurality of transistors (e.g. transistors 130_0a, 130_0b, 130_1a, 130_1b, 130_2a, 130_2b, ...); and the sense amplifiers SA0 and SA1.

The memory cell array 520 includes multi bit type memory cells in the configuration. The multi bit type memory cells can output different data by changing the directions of the current. DS[8M−1:0] are sub bit line selection signals applied to control terminals of transistors (transistors 520_1, 520_2, ..., and 520_16 are shown in FIG. 14) between the common voltage source COMMON and sub bit lines. SS[4M−1:0] are sub bit line selection signals applied to the control terminals of the transistors (the transistors 521_1, 521_2, 521_3, ..., 521_16 are shown in FIG. 14) between the main bit lines and the sub bit lines. Other configurations of the semiconductor circuit 500 of the fifth embodiment are similar to those of the semiconductor memory circuit 100 of the first embodiment.

SBL[16:0] are sub bit lines, and MBL[3:0] are main bit lines. The main bit lines MBL[3:0] connect to M memory cell arrays 520, but only one memory cell array 520 is shown in FIG. 14. In FIG. 14, only word line WL0, which is one of the word lines, is shown.

Figure 15:
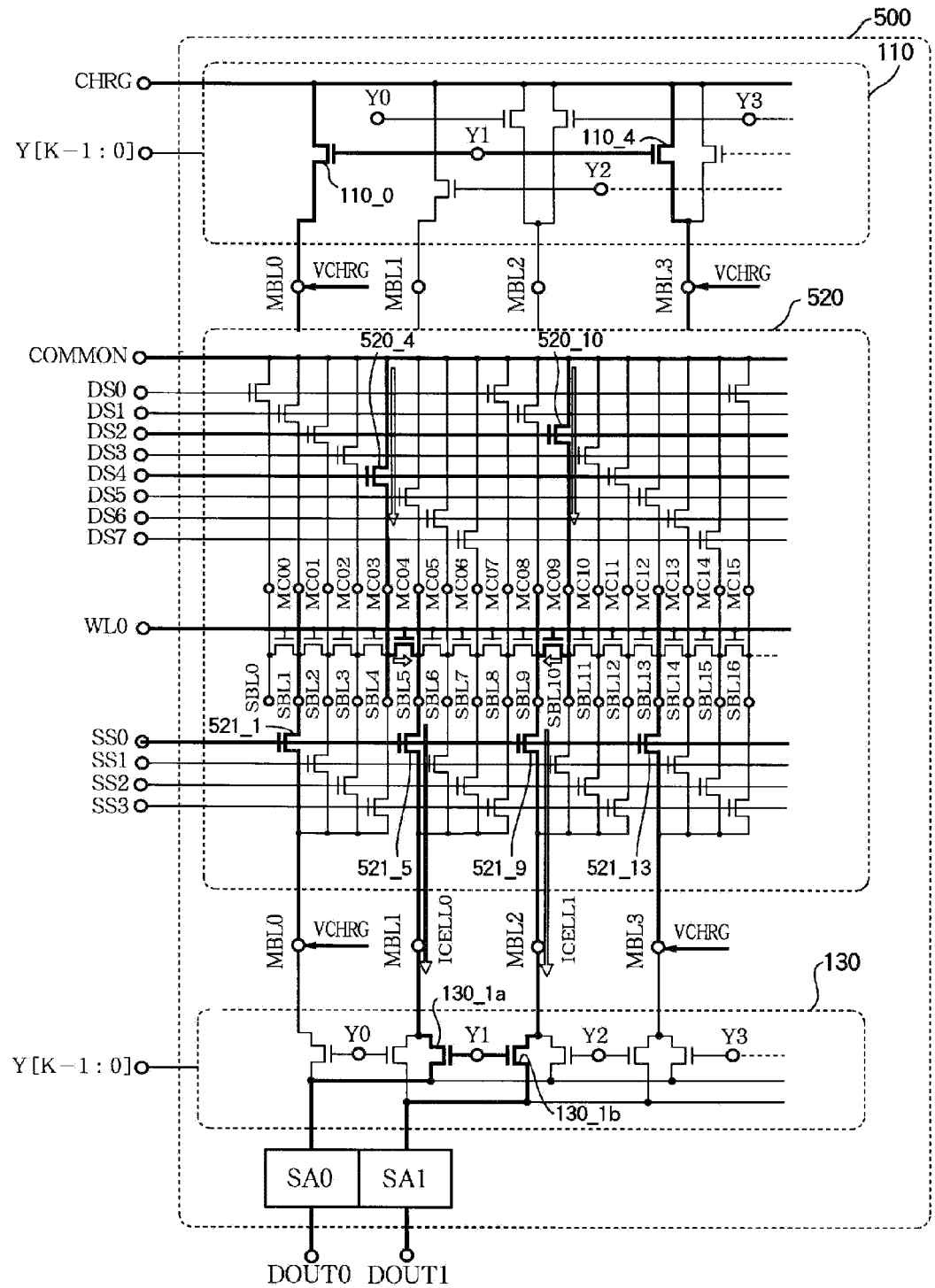
FIG. 15 is an explanatory diagram of the data reading operation of the semiconductor memory circuit according to the fifth embodiment.

FIG. 15 is an explanatory diagram of data reading operation of the semiconductor memory circuit 500 according to the fifth embodiment. Referring now to FIG. 15, the data reading operation of the semiconductor memory circuit 500 will be described. In this description, a case of selecting the memory cells MC04 and MC09 is provided.

Selecting the word line WL0 in the memory cell array 520, the memory cells MC00, ..., MC15 in the row that includes the memory cells MC04 and MC09 are electrically connected. Selecting the sub bit line selection signals DS2 and DS4, the common voltage source COMMON connects to one diffusion layer of the memory cell MC04 via the transistor 520_4 and the sub bit line SBL4, and the common voltage source COMMON connects to one diffusion layer of the memory cell MC09 via the transistor 520_10 and the sub bit line SBL10.

Selecting the sub bit selection signal SS0, the main bit line MBL1 connects to the other diffusion layer of the memory cell MC04 via the transistor 521_5 and the sub bit line SBL5, and the main bit line MBL2 connects to the other diffusion layer of the memory cell MC09 via the transistor 521_9 and the sub bit line SBL9.

Selecting the main bit line selection signal Y1 in the first multiplexer 130, the main bit line MBL1 connects to the sense amplifier SA0 via the transistor 130_1a, and the main bit line MBL2 connects to the sense amplifier SA1 via the transistor 130_1b.

With this operation, the memory cells MC04 and MC09 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the $(4\alpha+\beta)$th ($\alpha=0, 1, 2, \ldots, M-1$, $\beta=0, 1, 2, 3$) sub bit selection signal SS$(4\alpha+\beta)$ and the main bit selection signals Y$(2n-2)$ with even numbers (where $n=1, 2, \ldots$), the $((\alpha\times2+0)\times4+\beta)$th and the $((\alpha\times2+0)\times4+\beta+6)$th sub bit line selection signals DS$((\alpha\times2+0)\times4+\beta)$ and DS$((\alpha\times2+0)\times4+\beta+6)$ are selected, and in case of selecting the main bit line selection signal Y$(2n-1)$ with odd numbers, the $((\alpha\times2+1)\times4+(3))$th and the $((\alpha\times2+1)\times4+(3+6))$th sub bit line selection signals DS$((\alpha\times2+1)\times4+\beta)$ and DS$((\alpha\times2+1)\times4+\beta+6)$ are selected.

Here, in case of $(\alpha\times2+0)\times4+\beta+6 \geq ((\alpha+1)\times2)\times4$, instead of the $(\alpha\times2+0)\times4+\beta+6)$th, the $((\alpha-1)\times2+0)\times4+\beta+6)$th sub bit line selection signal DS $((\alpha-1)\times2+0)\times4+\beta+6)$ is selected. Similarly, in case of $(\alpha\times2+1)\times4+\beta+6$ $((\alpha+1)\times2)\times4$, instead of the $((\alpha\times2+1)+\beta+6)$th, the $((\alpha-1)\times2+1)\times4+\beta+6)$the sub bit signal selection signal DS$(((\alpha-1)\times2+1)\times4+\beta+6)$ is selected.

Selecting the main bit line selection signal Ym (where $m=0, 1, \ldots, K-1$) in the second multiplexer 110, the charging/discharging voltage source CHRG connects to the main bit lines MBL(m−1) and MBL(m+2). For example, selecting the main bit line signal Y1 in the second multiplexer 110, the charging/discharging voltage source CHRG connects to the main bit line MBL0 via the transistor 110_0 and the charging/discharging voltage source CHRG connects to the MBL3 via the transistor 110_4.

Selecting the sub bit line selection signal SS0 in the memory cell array 520, the main bit line MBL0 connects to the sub bit line SBL1 via the transistor 521_1, and the main bit line MBL3 connects to the sub bit line SBL13 via the transistor 521_13. With this operation, voltages of the main bit lines MBL0 and MBL3, sub bit lines SBL1 and SBL13 are set to the supply voltage value VCHRG of the charging/discharging voltage source CHRG.

As described above, although the semiconductor memory circuit 500 according to the fifth embodiment uses the memory cell array 520, similarly to the semiconductor memory circuit 100 of the first embodiment, it employs the circuit configuration, in which a pair of adjacent main bit lines is selected and the respective main bit lines connect to the sense amplifiers SA0 and SA1. Accordingly, in the semiconductor memory circuit 500 of the fifth embodiment, it is possible to reduce the influences among the main bit lines MBL2 and MBL1, the sub bit lines SBL9 and SBL5, and the sub bit lines SBL8, MBL7, and SBL6 similarly to the conventional semiconductor memory circuit 1000.

Furthermore, similarly to in the semiconductor memory circuit 100 of the first embodiment, in the semiconductor memory circuit 500 of the fifth embodiment, the voltages of the main bit lines MBL0 and MBL3 in the second multiplexer 110 are set to the value VCHRG.

With this setting, in the semiconductor memory circuit 500 of the fifth embodiment, it is possible to achieve a circuit that can reduce the voltage fluctuation of main bit lines that are adjacently provided outside the pair of selected adjacent main bit lines (e.g. the main bit line MBL0 that is adjacently provided outside the main bit line MBL1 and the main bit line MBL3 that is adjacently provided outside the main bit line MBL2), even in the memory cell array 520 using multi bit type memory cells.

In addition, being different from the memory cell array 320 of the semiconductor memory circuit 300, the memory cell array 520 of the semiconductor memory circuit 500 according to the fifth embodiment has four memory cells between the pair of selected adjacent main bit lines. Because of this, it is possible to increase the intervals between main bit lines and thereby reduce the coupling capacity between the main bit lines.

Therefore, according to the semiconductor memory circuit 500 of the fifth embodiment, the sense amplifiers SA0 and SA1 can precisely detect the original current of the memory cell to read.

Sixth Embodiment

Figure 16:
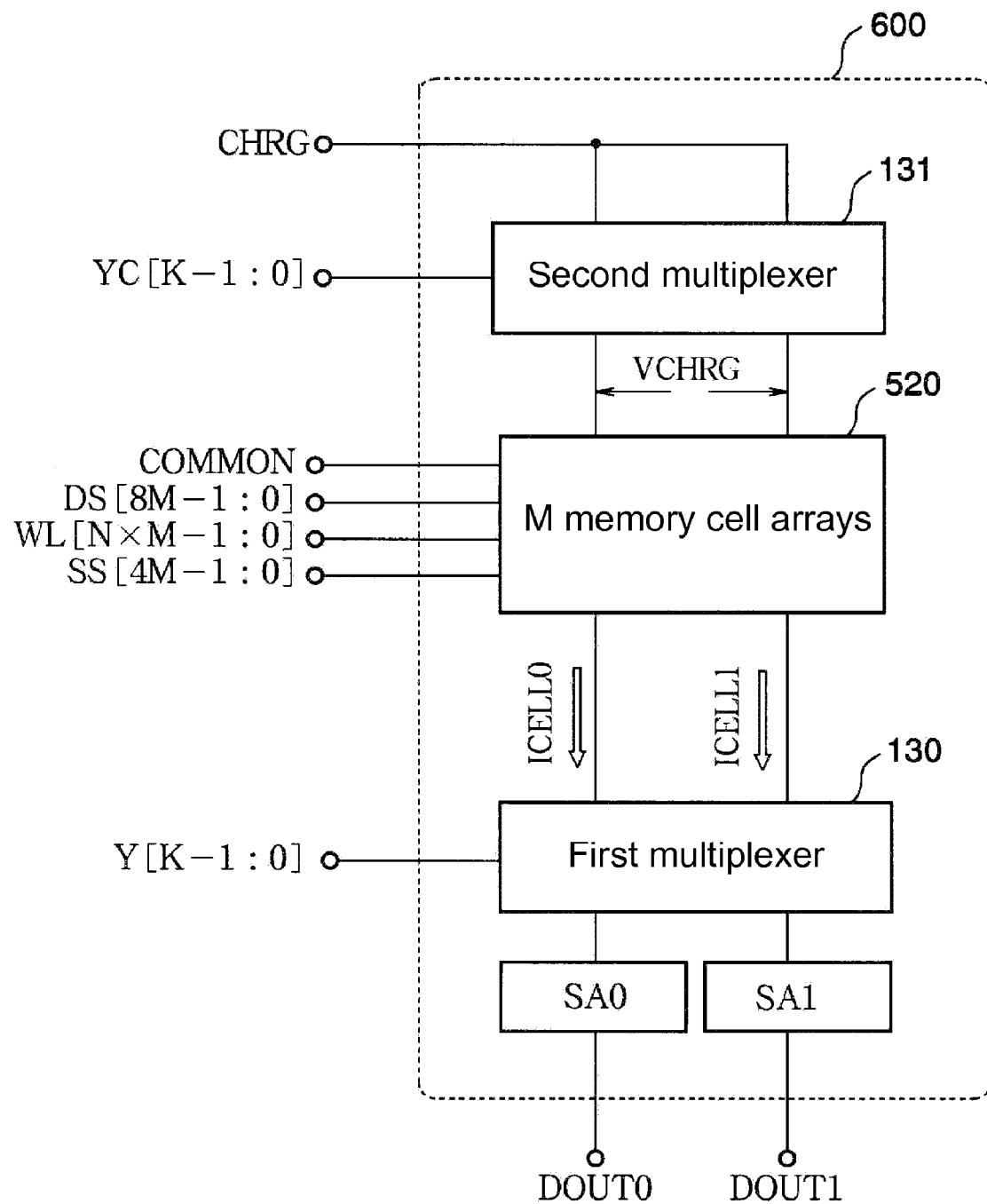
FIG. 16 is a block diagram schematically showing configuration of the semiconductor memory circuit according to a sixth embodiment.
Figure 17:
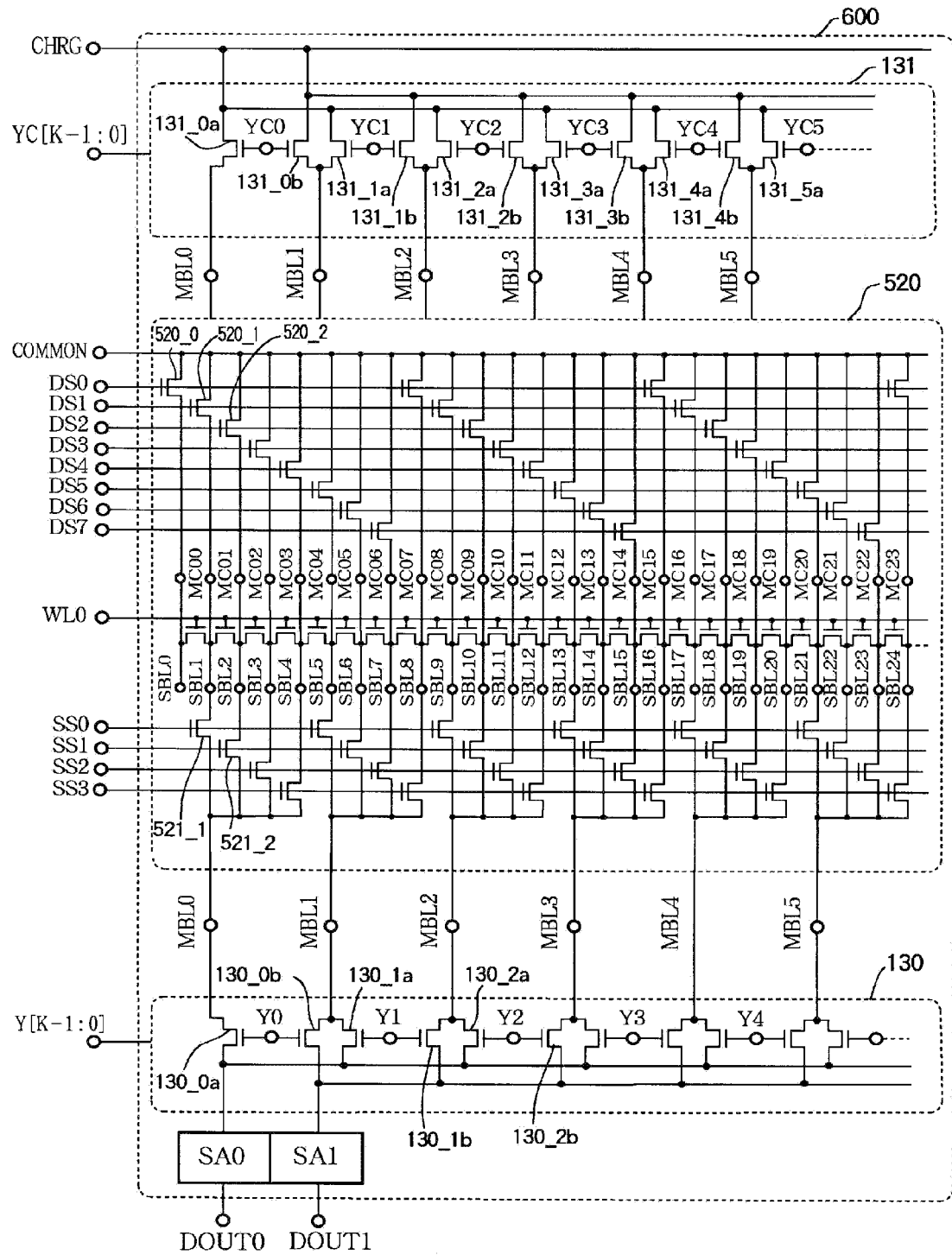
FIG. 17 is a circuit diagram including the second multiplexer, memory cell array, and the first multiplexer of the semiconductor memory circuit according to the sixth embodiment.

A sixth embodiment of the present invention will be explained next. FIG. 16 is a block diagram schematically showing the configuration of a semiconductor memory circuit 600 according to the sixth embodiment of the invention. FIG. 17 is a circuit diagram including a second multiplexer 131, the memory cell array 520, and the first multiplexer 130 of the semiconductor memory circuit 600 according to the sixth embodiment.

As shown in FIGS. 16 and 17, the semiconductor memory circuit 600 of the sixth embodiment includes a second multiplexer 131, which includes a plurality of transistors (e.g. transistors 131_0a, 131_0b, 131_1a, 131_1b, 131_2a, 131_2b, ...); M memory cell arrays 520, which include a plurality of memory cells (e.g. MC00, ..., MC23) aligned in rows and columns; a first multiplexer 130, which includes a plurality of transistors (e.g. transistors 130_0a, 130_0b, 130_1a, 130_1b, 130_2a, 130_2b, ...); and sense amplifiers SA0 and SA1. The memory cell array 520 is configured to use multi bit type memory cells.

The multi bit type memory cell can output different data by changing the directions of the current. DS[8M−1:0] are sub bit line selection signals applied to control terminals of transistors (transistors 520_0, 520_1, 520_2, 520_3, 520_4, ... are shown in FIG. 17) between the common voltage source COMMON and sub bit lines. SS[4M−1:0] are sub bit line selection signals applied to control terminals of the transistors (The transistors 321_1, 321_2, 321_3, 321_4, ... are shown in FIG. 17) between the main bit lines and sub bit lines. Other configurations of the semiconductor circuit 600 of the sixth embodiment are similar to those of the semiconductor memory circuit 200 of the second embodiment.

SBL[24:0] are sub bit lines, and MBL[5:0] are main bit lines. The main bit lines MBL[5:0] connect to M memory cell arrays 520, but only one memory cell array 520 is shown in FIG. 17. In FIG. 17, only word line WL0, which is one of the word lines connected to the M memory cell arrays, is shown. Here, each signal input to the semiconductor memory circuit 400 is input from a circuit (not illustrated) that controls the operation of the semiconductor memory circuit 400.

Figure 18:
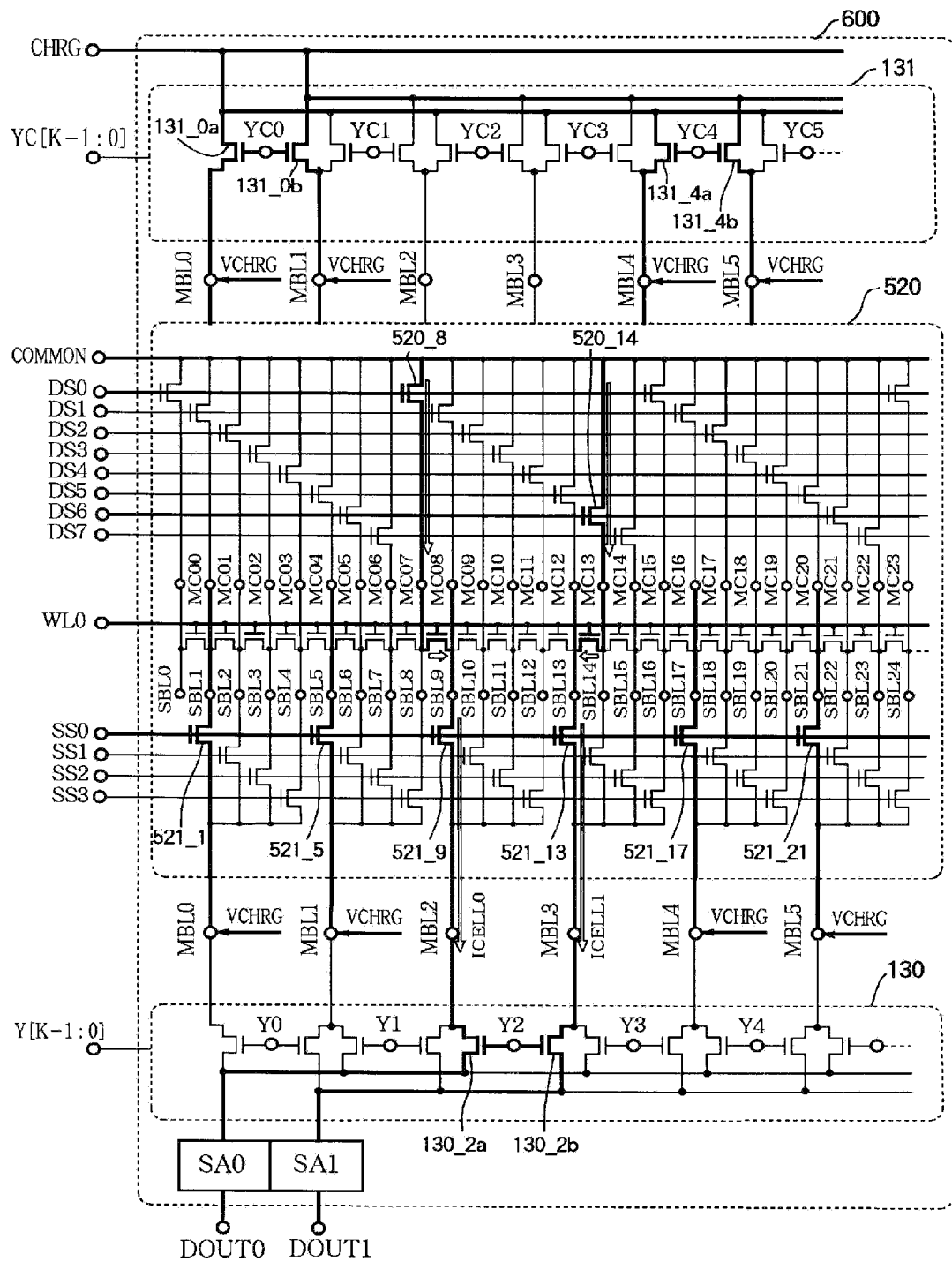
FIG. 18 is an explanatory diagram of the data reading operation of the semiconductor memory circuit according to the sixth embodiment.

FIG. 18 is an explanatory diagram of data reading operation of the semiconductor memory circuit 600 according to the sixth embodiment. Referring now to FIG. 18, the data reading operation of the semiconductor memory circuit 600 will be described. In this description, a case of selecting the memory cells MC08 and MC13 is provided. Selecting the word line WL0 in the memory cell array 520, the memory cells MC00, . . . , MC23 in the row that includes the memory cells MC08 and MC13 are electrically connected. Selecting the sub bit line selection signals DS0 and DS6, the common voltage source COMMON connects to one diffusion layer of the memory cell MC08 via the transistor 520_8 and the sub bit line SBL8, and the common voltage source COMMON is connected to one diffusion layer of the memory cell MC13 via the transistor 520_14 and the sub bit line SBL14.

Selecting the sub bit selection signal SS0, the main bit line MBL2 connects to the other diffusion layer of the memory cell MC08 via the transistor 521_9 and the sub bit line SBL9, and the main bit line MBL3 connects to the other diffusion layer of the memory cell MC13 via the transistor 521_13 and the sub bit line SBL13. Selecting the main bit line selection signal Y2 in the first multiplexer 130, the main bit line MBL2 connects to the sense amplifier SA0 via the transistor 130_2a, and the main bit line MBL3 connects to the sense amplifier SA1 via the transistor 130_2b.

With this operation, the memory cells MC08 and MC13 are in the selected states, current of current values ICELL0 and ICELL1 flow to the sense amplifiers SA0 and SA1, respectively. The sense amplifier SA0 outputs the logic level determined from the current value ICELL0 to the output terminal DOUT0, and the sense amplifier SA1 outputs the logic level determined from the current value ICELL1 to the output terminal DOUT1.

Here, in case of selecting the $(4\alpha+\beta)$th ($\alpha$=0, 1, 2, . . . , M−1, $\beta$=0, 1, 2, 3) sub bit selection signal SS($4\alpha+\beta$) and the main bit selection signals Y (2n−2) with even numbers (where n=1, 2, . . . ), the $((\alpha\times2+0)\times4+\beta)$th and the $((\alpha\times2+0)\times4+\beta+6)$th sub bit line selection signals DS($(\alpha\times2+0)\times4+\beta$) and DS($(\alpha\times2+0)\times4+\beta+6$) are selected.

In case of selecting the main bit line selection signals Y(2n−1) with odd numbers, the $((\alpha\times2+1)\times4+\beta)$th and the $((\alpha\times2+1)\times4+\beta+6)$th sub bit line selection signals DS($(\alpha\times2+1)\times4+\beta$) and DS($(\alpha\times2+1)\times4+\beta+6$) are selected. Here, in case of $(\alpha\times2+0)\times4+\beta+6\geq((\alpha+1)\times2)\times4$, instead of the $((\alpha\times2+0)\times4+\beta+6)$th, the $((\alpha-1)\times2+0)\times4+\beta+6)$th sub bit signal selection signal DS$(((\alpha-1)\times2+0)\times4+\beta+6)$ is selected.

Here, in case of $(\alpha\times2+0)\times4+\beta+6\geq((\alpha+1)\times2)\times4$, instead of the $((\alpha\times2+0)\times4+\beta+6)$th, the $((\alpha-1)\times2+0)\times4+\beta+6)$th sub bit line selection signal DS$(((\alpha-1)\times2+0)\times4+\beta+6)$ is selected. Similarly, in case of $(\alpha\times2+1)\times4+\beta+6\geq((\alpha+1)\times2)\times4$, instead of the $((\alpha\times2+1)\times4+\beta+6)$th, the $((\alpha-1)\times2+1)\times4+\beta+6)$th sub bit signal selection signal DS$(((\alpha-1)\times2+1)\times4+\beta+6)$ is selected.

Selecting the main bit line selection signal YCp (where p=0, 1, . . . , K−1) in the second multiplexer 131, the charging/discharging voltage source CHRG connects to the main bit lines MBLp and MBL(p+1). In addition, selecting the main bit line signal YC(p+4) in the second multiplexer 131, the charging/discharging voltage source CHRG connects to the main bit lines MBL(p+4) and MBL(p+5).

For example, selecting the main bit line signal YC0 in the second multiplexer 131, the charging/discharging voltage source CHRG connects to the main bit lines MBL0 and MBL1 via the transistors 131_0a and 131_0b. Furthermore, selecting the main bit line signal YC4, the charging/discharging voltage source CHRG connects to the main bit lines MBL4 and MBL5 via the transistors 131_4a and 131_4b.

Selecting the sub bit line selection signal SS0 in the memory cell array 520, the main bit lines MBL0, MBL1, MBL4, and MBL5 connect to the sub bit lines SBL1, SBL5, SBL17, and SBL21 via the transistors 521_1, 521_5, 521_17, and 521_21, respectively. With those connections, the voltages of the main bit lines MBL0, MBL1, MBL4, and MBL5 and the sub bit lines SBL1, SBL5, SBL17, and SBL21 are set to the value, VCHRG.

Here, in case of selecting the $\gamma$th ($\gamma$=0, 1, 2, . . . , K−1) main bit line selection signal Y$\gamma$, $\gamma\pm2$ main bit line selection signals YC($\gamma$−2) and YC($\gamma$+2) are selected. Here, in case of $\gamma$−2<0, the ($\gamma$−2+K)th main bit line selection signal YC is selected. In addition, in case of $\gamma$+2>K−1, the ($\gamma$+2−K)th main bit line selection signal YC is selected.

As described above, the semiconductor memory circuit 600 according to the sixth embodiment uses the memory cell array 520, but similarly to the semiconductor memory circuit 200 of the second embodiment, it employs the circuit configuration, in which a pair of adjacent main bit lines is selected and the respective main bit lines connect to the sense amplifiers SA0 and SA1. Accordingly, in the semiconductor memory circuit 600 of the sixth embodiment, it is possible to reduce the influences among the main bit lines MBL2 and MBL3, the sub bit lines SBL9 and SBL13, and the sub bit lines SBL10, SBL11, and SBL12, similarly to the conventional semiconductor memory circuit 1000.

Being different from the semiconductor memory circuit 300 of the third embodiment, the semiconductor memory circuit 600 of the sixth embodiment uses the second multiplexer 131 for selecting the main bit lines to connect to the charging/discharging voltage source CHRG. Similarly to the semiconductor memory circuit 200 of the second embodiment, in the semiconductor memory circuit 600 of the sixth embodiment, the voltages of the main bit lines MBL0, MBL1, MBL4, and MBL5 are set to the value VCHRG by the second multiplexer 131.

With this setting, in the semiconductor memory circuit 600 of the sixth embodiment, it is possible to achieve a circuit that can reduce the voltage fluctuation of the main bit lines that are adjacently provided outside the pair of selected adjacent main bit lines (e.g. the main bit lines MBL1 and MBL0 that are adjacently provided outside the main bit line MBL2 and the main bit lines MBL4 and MBL5 that are adjacently provided outside the main bit line MBL3).

Therefore, according to the semiconductor memory circuit 600 of the sixth embodiment, the sense amplifiers SA0 and SA1 can precisely detect the original current of the memory cell to read.

In addition, similarly to the semiconductor memory circuit 200 of the second embodiment, in the semiconductor memory circuit 600 of the sixth embodiment, it is possible to enhance the efficiency in making the circuit and to achieve the effect of reducing the circuit size by using the second multiplexer 131.

Moreover, being different from the memory cell array 320 of the semiconductor memory circuit 300, in the memory cell array 520 of the semiconductor memory circuit 600 of the sixth embodiment, there are four memory cells between the pair of the selected adjacent main bit lines. Accordingly, it is possible to increase the main bit line intervals and thereby reduce the coupling capacity between the main bit lines.

Here, the semiconductor memory circuits described in the first through the sixth embodiments may be applied in data reading of non-volatile semiconductor memory circuit.

Furthermore, the third through the sixth embodiments suggest that it may be possible to apply the first and the second embodiments to a memory cell arrays that use multi-bit type memory cells.

Moreover, as described in the first through the sixth embodiments, in this invention, the number of memory cells to interpose two memory cells between a pair of main bit lines, and the semiconductor memory circuits described in the fifth and the sixth embodiments are examples of interposing the four memory cells between a pair of the main bit lines.

As described in the first through the sixth embodiments, in this invention, the number of memory cells to interpose between the main bit lines may be set to any number.

Moreover, the first through the sixth embodiments are described with configurations, in which drain voltages (1.0 V to 2.0 V) of the memory cells are used for the common voltage and current flows into the sense amplifiers SA0 and SA1, but it is also possible to employ the configuration, in which current flows out from the sense amplifiers SA0 and SA1, changing the direction of the current flow to the opposite and using the source voltage ($\approx$, 0.0 V) of the memory cell for the common voltage.

The disclosure of Japanese Patent Application No. 2009-270341, filed on Nov. 27, 2009, is incorporated in the application.

While the invention has been explained with reference to the specific embodiments of the invention, the explanation is illustrative and the invention is limited only by the appended claims.

What is claimed is:

1. A semiconductor memory circuit, comprising:
a memory cell array having a plurality of memory cells arranged in a row direction and a column direction;
a row selecting unit for selecting the memory cells of the memory cell array aligned in the row direction;
a column selecting unit for selecting the memory cells of the memory cell array aligned in the column direction;
a plurality of main bit lines for outputting data of the memory cells;
a data reading unit for reading data of at least one of the memory cells selected with the row selecting unit and the column selecting unit;
a first multiplexer for connecting at least one of the main bit lines connected to the one of the memory cells to the data reading unit; and
a second multiplexer for connecting an adjacent main bit line situated adjacently outside the one of the main bit lines to a charging/discharging voltage source for setting at a specific voltage,
wherein said data reading unit includes a first sense amplifier and a second sense amplifier, said row selecting unit being arranged to select a pair of the memory cells connected to a pair of the main bit lines arranged adjacently, said first multiplexer being arranged to connect the pair of the main bit lines to the first sense amplifier and the second sense amplifier, respectively.

2. The semiconductor memory circuit according to claim 1, wherein said second multiplexer is arranged to connect the main bit lines situated outside the pair of the main bit lines to the charging/discharging voltage source.

3. The semiconductor memory circuit according to claim 1, wherein said second multiplexer is arranged to connect the adjacent main bit lines situated adjacently outside each of the pair of the main bit lines to the charging/discharging voltage source.

4. The semiconductor memory circuit according to claim 1, wherein said second multiplexer is formed of a circuit the same as that of the first multiplexer.

5. The semiconductor memory circuit according to claim 1, wherein said memory cell array includes a multi bit type memory cell.

6. The semiconductor memory circuit according to claim 1, wherein said memory cell includes a transistor having a gate, a pair of diffusion layers as a source or a drain, said row selecting unit including a word line connected to the gate.

7. The semiconductor memory circuit according to claim 6, wherein said row selecting unit includes a first sub bit line for connecting one of the diffusion layers to a common voltage source, a first transistor disposed between the common voltage source and the first sub bit line, a second sub bit line for connecting the other of the diffusion layers to the main bit line, and a second transistor disposed between the main bit line and the second sub bit line.

* * * * *